United States Patent
Ryu

(10) Patent No.: US 12,444,720 B2
(45) Date of Patent: Oct. 14, 2025

(54) DISPLAY DEVICE AND METHOD OF MANUFACTURING THE SAME

(71) Applicant: Samsung Display Co., Ltd., Yongin-Si (KR)

(72) Inventor: Sae-Hee Ryu, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 749 days.

(21) Appl. No.: 17/556,110

(22) Filed: Dec. 20, 2021

(65) Prior Publication Data

US 2022/0320395 A1  Oct. 6, 2022

(30) Foreign Application Priority Data

Apr. 1, 2021 (KR) .................. 10-2021-0042773

(51) Int. Cl.
| | |
|---|---|
| *H01L 25/16* | (2023.01) |
| *G09F 9/302* | (2006.01) |
| *H01L 25/075* | (2006.01) |
| *H10H 20/01* | (2025.01) |
| *H10H 20/831* | (2025.01) |
| *H10H 20/853* | (2025.01) |
| *H10H 20/857* | (2025.01) |
| *H10K 59/131* | (2023.01) |
| *H10K 59/80* | (2023.01) |

(52) U.S. Cl.
CPC .......... *H01L 25/167* (2013.01); *G09F 9/3026* (2013.01); *H01L 25/0753* (2013.01); *H10H 20/01* (2025.01); *H10H 20/831* (2025.01); *H10H 20/853* (2025.01); *H10H 20/857* (2025.01); *H10K 59/131* (2023.02); *H10H 20/032* (2025.01); *H10H 20/0362* (2025.01); *H10H 20/0364* (2025.01); *H10K 59/873* (2023.02)

(58) Field of Classification Search
CPC . H01L 25/167; H01L 25/0753; H10K 59/131; H10K 59/873; H10H 20/01; H10H 20/853; H10H 20/0362; H10H 20/0364; H10H 20/032; H10H 20/831; H10H 20/857; G09F 9/3026
See application file for complete search history.

(56) References Cited

U.S. PATENT DOCUMENTS

| | | | |
|---|---|---|---|
| 2014/0092034 A1* | 4/2014 | Franklin | ............... H05K 1/028 345/173 |
| 2018/0013095 A1 | 1/2018 | Choi et al. | |
| 2018/0090698 A1 | 3/2018 | Jeong et al. | |

(Continued)

FOREIGN PATENT DOCUMENTS

| | | |
|---|---|---|
| KR | 20180005313 A | 1/2018 |
| KR | 20180034780 A | 4/2018 |
| KR | 101951366 B1 | 2/2019 |

*Primary Examiner* — Richard A Booth
(74) *Attorney, Agent, or Firm* — CANTOR COLBURN LLP

(57) ABSTRACT

A display device includes a first substrate having a flexibility, a thin film transistor layer disposed on the first substrate, where the thin film transistor layer includes a thin film transistor, a first circuit board disposed under the first substrate, and a second circuit board electrically connecting the first circuit board and the thin film transistor to each other. A portion of the second circuit board is disposed between the first substrate and the thin film transistor layer.

18 Claims, 36 Drawing Sheets

(56) References Cited

U.S. PATENT DOCUMENTS

| | | | | |
|---|---|---|---|---|
| 2019/0237531 | A1* | 8/2019 | Chen | H10K 71/00 |
| 2020/0203325 | A1* | 6/2020 | Lee | H01L 23/13 |
| 2021/0133419 | A1* | 5/2021 | Wang | G06V 40/1318 |
| 2021/0280094 | A1* | 9/2021 | Zheng | G09F 9/301 |
| 2022/0229502 | A1* | 7/2022 | Lee | G06F 3/044 |

* cited by examiner

DISPLAY DEVICE AND METHOD OF MANUFACTURING THE SAME

This application claims priority to Korean Patent Application No. 10-2021-0042773, filed on Apr. 1, 2021, and all the benefits accruing therefrom under 35 U.S.C. § 119, the content of which in its entirety is herein incorporated by reference.

BACKGROUND

1. Field

Embodiments of the invention relate to a display device and method of manufacturing the display device. More particularly, embodiments of the invention relate to a tiled display device and method of manufacturing the tiled display device.

2. Description of the Related Art

In general, a tiled display may include a plurality of display devices to implement a large screen. In such a tiled display, a bezel positioned at a boundary between adjacent display devices may be recognized by a user, and thus a display quality of the tiled display device may be decreased.

SUMMARY

Embodiments of the invention provide a display device with improved display quality.

Embodiments of the invention also provide a method of manufacturing the display device with improved display quality.

An embodiment of a display device includes a first substrate having flexibility, a thin film transistor layer disposed on the first substrate, where the thin film transistor layer includes a thin film transistor, a first circuit board disposed under the first substrate, and a second circuit board electrically connecting the first circuit board and the thin film transistor to each other. In such an embodiment, a portion of the second circuit board is disposed between the first substrate and the thin film transistor layer.

In an embodiment, a first end portion of the second circuit board may be disposed between the first substrate and the thin film transistor layer, and a second end portion of the second circuit board opposite to the first end portion may be disposed under the first substrate.

In an embodiment, the display device may further include a pad electrode disposed between the first substrate and the thin film transistor layer and a connection line disposed between the first substrate and the pad electrode. In such an embodiment, a first end portion of the connection line may be connected to the second circuit board, and a second end portion of the connection line opposite to the first end portion may be connected to the pad electrode.

In an embodiment, the display device may further include a second substrate disposed between the connection line and the thin film transistor layer.

In an embodiment, a first end portion of the second circuit board connected to the first end portion of the connection line may be disposed between the connection line and the second substrate.

In an embodiment, the display device may further include a first barrier layer disposed between the first substrate and the connection line and a second barrier layer disposed between the connection line and the second substrate.

In an embodiment, the first end portion of the connection line may be spaced apart from the second barrier layer, and the second end portion of the connection line may contact the second barrier layer.

In an embodiment, a first end portion of the second circuit board connected to the first end portion of the connection line may be disposed between the connection line and the second barrier layer.

In an embodiment, the second substrate may include a first portion overlapping the second end portion of the connection line and having a first height and a second portion overlapping the first end portion of the connection line and having a second height less than the first height.

In an embodiment, a through hole may be defined through the second substrate to expose at least a portion of the second end portion of the connection line. In such an embodiment, the pad electrode may be electrically connected to the connection line through the through hole.

In an embodiment, the display device may further include a light emitting element layer disposed on the thin film transistor layer and an encapsulation layer disposed on the light emitting element layer.

In an embodiment, the display device may further include a light emitting element layer disposed between the connection line and the thin film transistor layer and an encapsulation layer disposed between the connection line and the light emitting element layer.

In an embodiment, a through hole may be defined through the encapsulation layer to expose at least a portion of the second end portion of the connection line. In such an embodiment, the pad electrode may be electrically connected to the connection line through the through hole.

In an embodiment, the first substrate may include a first portion overlapping the second end portion of the connection line and a second portion overlapping the first end portion of the connection line.

In an embodiment, the second portion of the first substrate may be disposed at an edge of the first substrate.

In an embodiment, the first substrate may further include a third portion spaced apart from the first portion with the second portion interposed therebetween, and spaced apart from the second portion. In such an embodiment, a bending portion of the second circuit board may be disposed in an opening defined between the second portion of the first substrate and the third portion of the first substrate.

In an embodiment, a first end portion of the first circuit board may be connected to the second circuit board. The display device may further include a fixing member which fixes a second end portion of the first circuit board opposite to the first end portion to a lower surface of the first substrate.

In an embodiment, a first distance between the first substrate and the first end portion of the first circuit board may be greater than a second distance between the first substrate and the second end portion of the first circuit board.

An embodiment of a method of manufacturing a display device includes providing a first substrate having flexibility on a carrier substrate, providing a connection line on the first substrate, forming an opening penetrating the first substrate in the first substrate, providing an organic layer covering the opening and a first end portion of the connection line adjacent to the opening, providing a second substrate covering the organic layer and the connection line, forming a through hole exposing a second end portion of the connection line opposite to the first end portion in the second substrate, providing a pad electrode electrically connected to the second end portion of the connection line through the through hole, providing a thin film transistor layer including a thin film transistor on the second substrate, separating the carrier substrate from the first substrate, removing the organic layer, and bonding a circuit board electrically connected to the pad electrode on the first end portion of the connection line.

In an embodiment, a first end portion of the circuit board bonded to the first end portion of the connection line may be disposed between the first substrate and the second substrate, and a second end portion of the circuit board opposite to the first end portion may be disposed under the first substrate.

In an embodiment, the first substrate may include a first portion overlapping the second end portion of the connection line, and a second portion overlapping the first end portion of the connection line. In such an embodiment, the bonding the circuit board may include bonding the circuit board after peeling the second portion of the first substrate from the second substrate while the first portion of the first substrate is fixed to the second substrate.

In an embodiment, the organic layer may expose the second end portion of the connection line.

In an embodiment, the removing the organic layer may include dissolving the organic layer using a solvent.

An embodiment of a method of manufacturing a display device includes providing a lower structure including a first substrate having flexibility and a connection line disposed on the first substrate, providing an upper structure including a thin film transistor layer including a thin film transistor, and a pad electrode electrically connected to the thin film transistor, combining the upper structure and the lower structure to each other in a way such that the pad electrode overlaps a first end portion of the connection line, and bonding a circuit board electrically connected to the pad electrode on a second end portion of the connection line opposite to the first end portion.

In an embodiment, a first end portion of the circuit board bonded to the second end portion of the connection line may be disposed between the first substrate and the upper structure, and a second end portion of the circuit board opposite to the first end portion may be disposed under the first substrate.

In an embodiment, the first substrate may include a first portion overlapping the first end portion of the connection line, and a second portion overlapping the second end portion of the connection line. In such an embodiment, the bonding the circuit board may include bonding the circuit board after peeling the second portion of the first substrate from the upper structure while the first portion of the first substrate is fixed to the upper structure.

In an embodiment, the providing the lower structure may include providing the first substrate on a first carrier substrate, providing the connection line on the first substrate, forming an opening through the first substrate, and bonding a conductive adhesive member to the first end portion of the connection line.

In an embodiment, the method of manufacturing the display device may further include separating the first carrier substrate from the first substrate before bonding of the circuit board.

In an embodiment, the providing the upper structure may include providing a second substrate on a second carrier substrate, forming a through hole through the second substrate, providing the pad electrode covering the through hole, and providing the thin film transistor layer on the pad electrode. In such an embodiment, the combining the upper structure and the lower structure to each other may include combining the upper structure and the lower structure to each other after separating the second carrier substrate from the second substrate.

In an embodiment, the forming of the upper structure may include providing a second substrate on a second carrier substrate, providing the thin film transistor layer on the second substrate, providing an encapsulation layer on the thin film transistor layer, forming a through hole through the encapsulation layer, and forming the pad electrode covering the through hole. In such an embodiment, the combining the upper structure and the lower structure may to each other include combining the upper structure and the lower structure to each other after turning the upper structure over such that the pad electrode is positioned under the thin film transistor layer.

Embodiments of the display device according to the invention may include the circuit board disposed under the substrate layer. The circuit board may be connected to the pad electrode through the connection line disposed inside the substrate layer. Accordingly, a dead space of the display device may be reduced. In such an embodiment, when the display device is a tiled display including a plurality of display devices, it is possible to prevent or reduce external visibility of a boundary between adjacent display devices among the plurality of display devices included in the tiled display device. Accordingly, a display quality of the tiled display device may be improved.

In embodiments of the method of manufacturing the display device according to the invention, the bonding process of the circuit board may be performed in a state in which a bonding area of the lower substrate to which the circuit board is bonded is peeled from the upper substrate. Accordingly, heat or pressure applied to the bonding area may be prevented or reduced from being transferred to the inside of the display device during the bonding process of the circuit board, such that a display quality of the display device may be improved, and a reliability of the display device may be improved.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
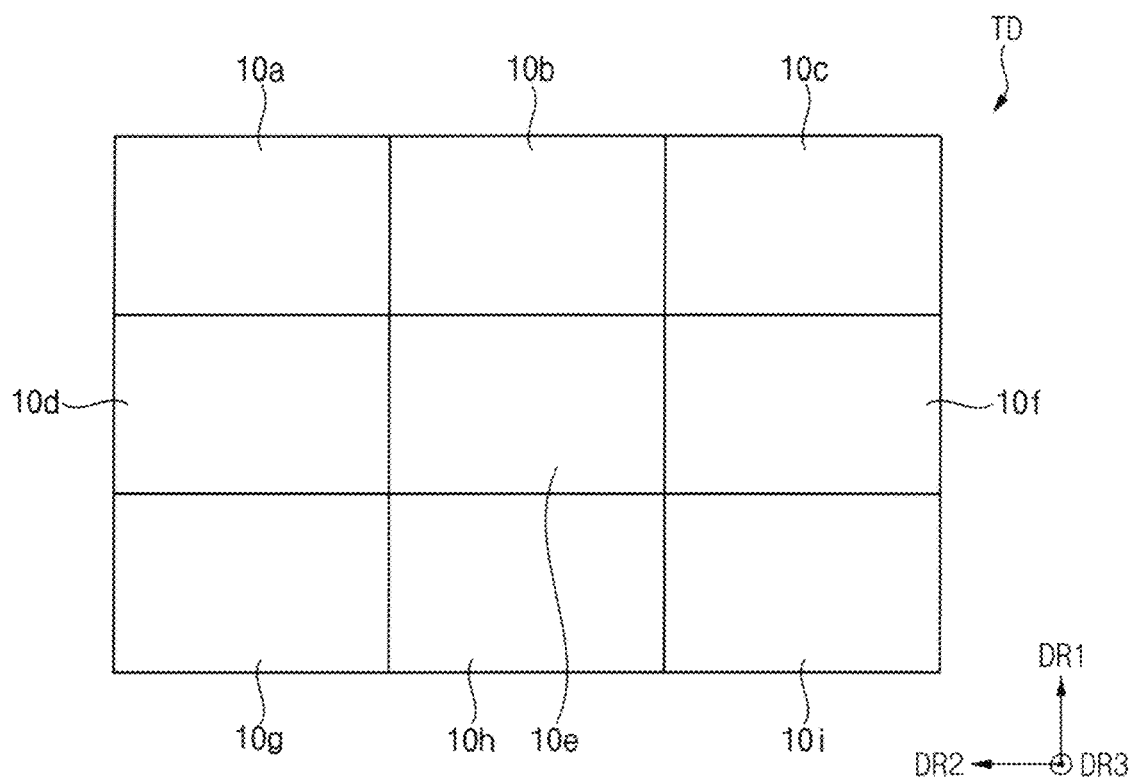
FIG. 1 is a plan view illustrating a tiled display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. For example, "an element" has the same meaning as "at least one element," unless the context clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a plan view illustrating a tiled display device according to an embodiment.

Referring to FIG. 1, an embodiment of a display device may be a tiled display device TD including a plurality of display devices. Each of the plurality of the display devices may display an individual image or a corresponding part of one image. The plurality of the display devices may respectively include display panels of a same type, a same structure, a same size, or a same type, but embodiments are not limited thereto.

In an embodiment, the plurality of the display devices may be arranged in a matrix form along a first direction DR1 and a second direction DR2 crossing the first direction DR1. In one embodiment, for example, as illustrated in FIG. 1, the tiled display device TD may include first to ninth display devices 10a to 10i arranged in a 3×3 shape in a plan view. The first to ninth display devices 10a to 10i may display first to ninth images, respectively. A user may view an image in which the first to ninth images are combined. However, embodiments are not limited thereto, and the tiled display device TD may include 2 to 8 or 10 or more display devices.

Figure 2:
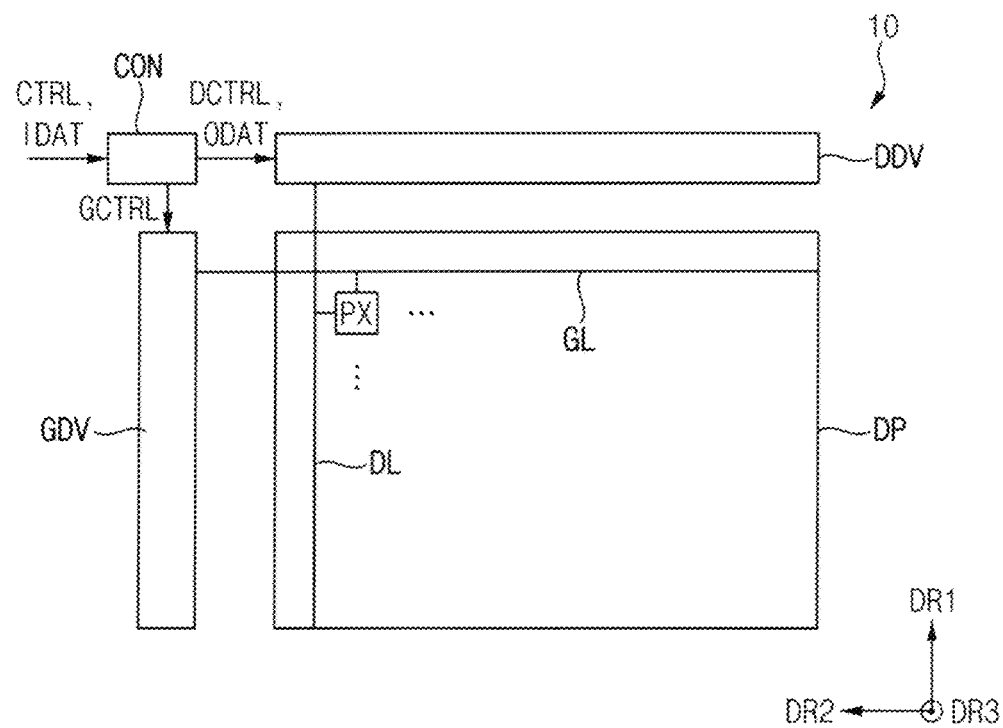
FIG. 2 is a block diagram illustrating a display device according to an embodiment.

FIG. 2 is a block diagram illustrating a display device according to an embodiment. Particularly, the display device 10 of FIG. 2 may illustrate an embodiment of one of the first to ninth display devices 10a to 10i of FIG. 1.

Referring to FIG. 2, an embodiment of the display device 10 may include a display panel DP and a driver. The driver may include a driving controller CON, a gate driver GDV, and a data driver DDV The display panel DP may include pixels PX, gate lines GL, and data lines DL. The pixels PX may be disposed in a display area in which an image is displayed. The pixels PX may be electrically connected to the gate lines GL and the data lines DL. In one embodiment, for example, the pixels PX may be arranged in a matrix form along the first and second directions DR1 and DR2. In one embodiment, for example, the second direction DR2 may be perpendicular to the first direction DR1. Each of the pixels PX may include a thin film transistor and a light emitting element. The light emitting element may generate a light. The light emitting element may be an inorganic light emitting diode or an organic light emitting diode.

The gate lines GL and the data lines DL may cross each other. In one embodiment, for example, each of the gate lines GL may generally extend in the second direction DR2, and the gate lines GL may be arranged in the first direction DR1. Each of the data lines DL may generally extend in the first direction DR1, and the data lines DL may be arranged in the second direction DR2.

The driving controller CON may generate a gate control signal GCTRL, a data control signal DCTRL, and an output image data ODAT based on an input image data IDAT and an input control signal CTRL provided from an external device. In one embodiment, for example, the input image data IDAT may be RGB data including red image data, green image data, and blue image data. The input control signal CTRL may include a master clock signal and an input data enable signal. The input control signal CTRL may further include a vertical synchronization signal and a horizontal synchronization signal.

The gate driver GDV may generate gate signals based on the gate control signal GCTRL provided from the driving controller CON. In one embodiment, for example, the gate control signal GCTRL may include a vertical start signal and a gate clock signal. The gate driver GDV may sequentially output the gate signals to the gate lines GL included in the display panel DP.

The data driver DDV may generate data signals based on the data control signal DCTRL and the output image data ODAT provided from the driving controller CON. In one embodiment, for example, the data control signal DCTRL may include an output data enable signal, a horizontal start signal, and a load signal. The data driver DDV may output the data signals to the data lines DL included in the display panel DP.

In an embodiment, each of the gate driver GDV and the data driver DDV may be implemented as an integrated circuit ("IC"). Each of the gate driver GDV and the data driver DDV may include an IC chip, a substrate with an IC chip mounted thereon, a film with an IC chip mounted thereon, or the like.

Figure 3:
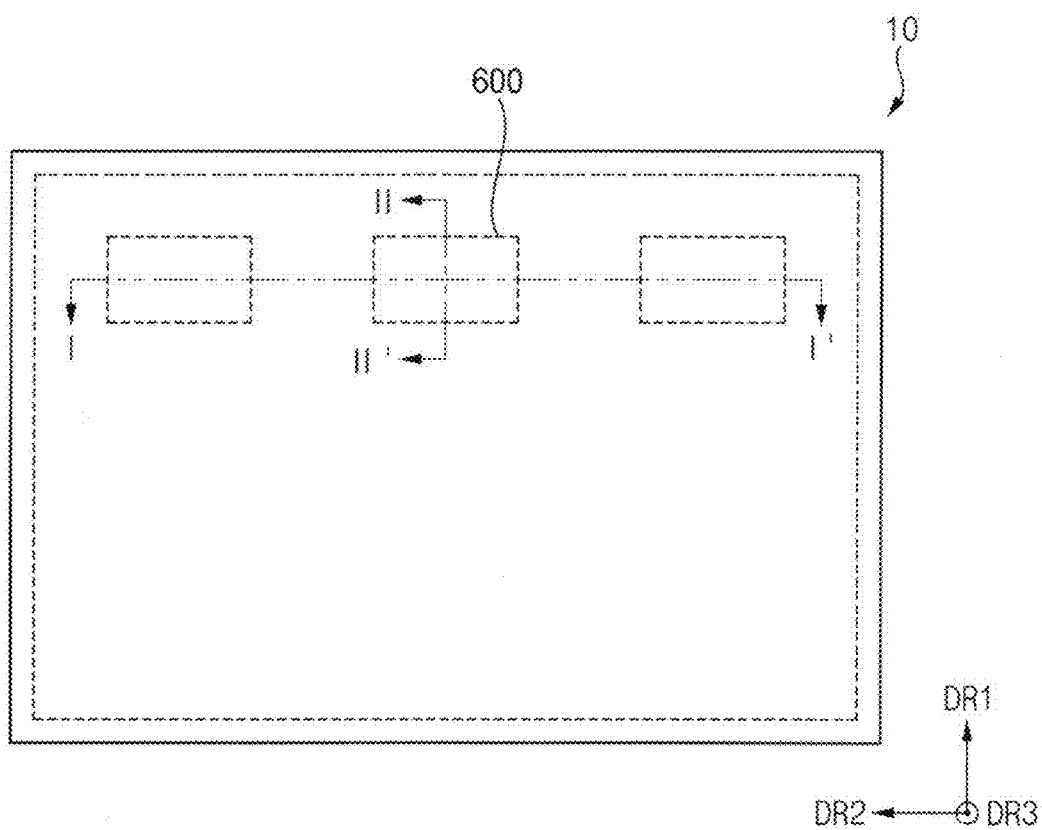
FIG. 3 is a plan view illustrating a display device according to an embodiment.
Figure 4:
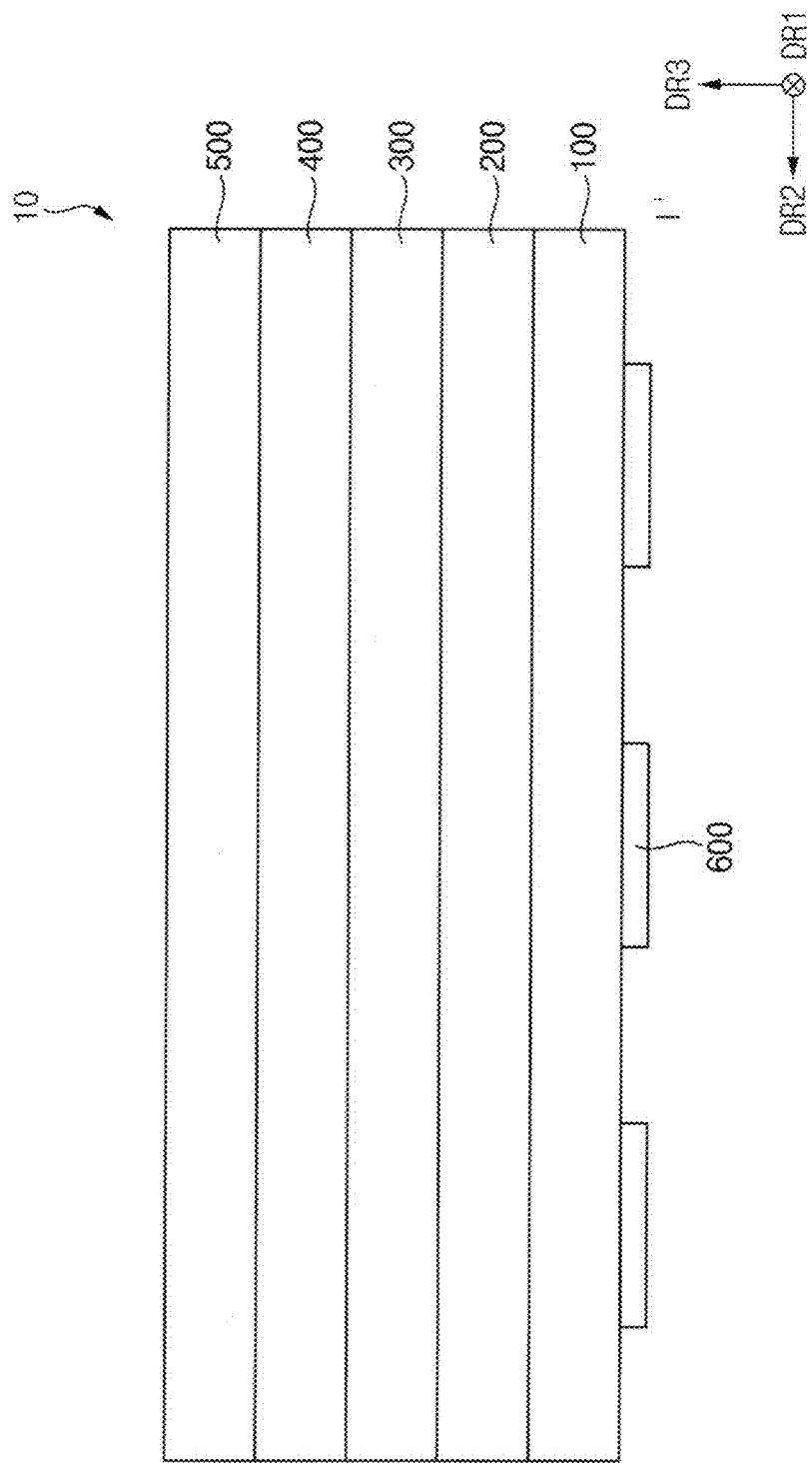
FIG. 4 is a cross-sectional view taken along line I-I' of FIG. 3.
Figure 5:
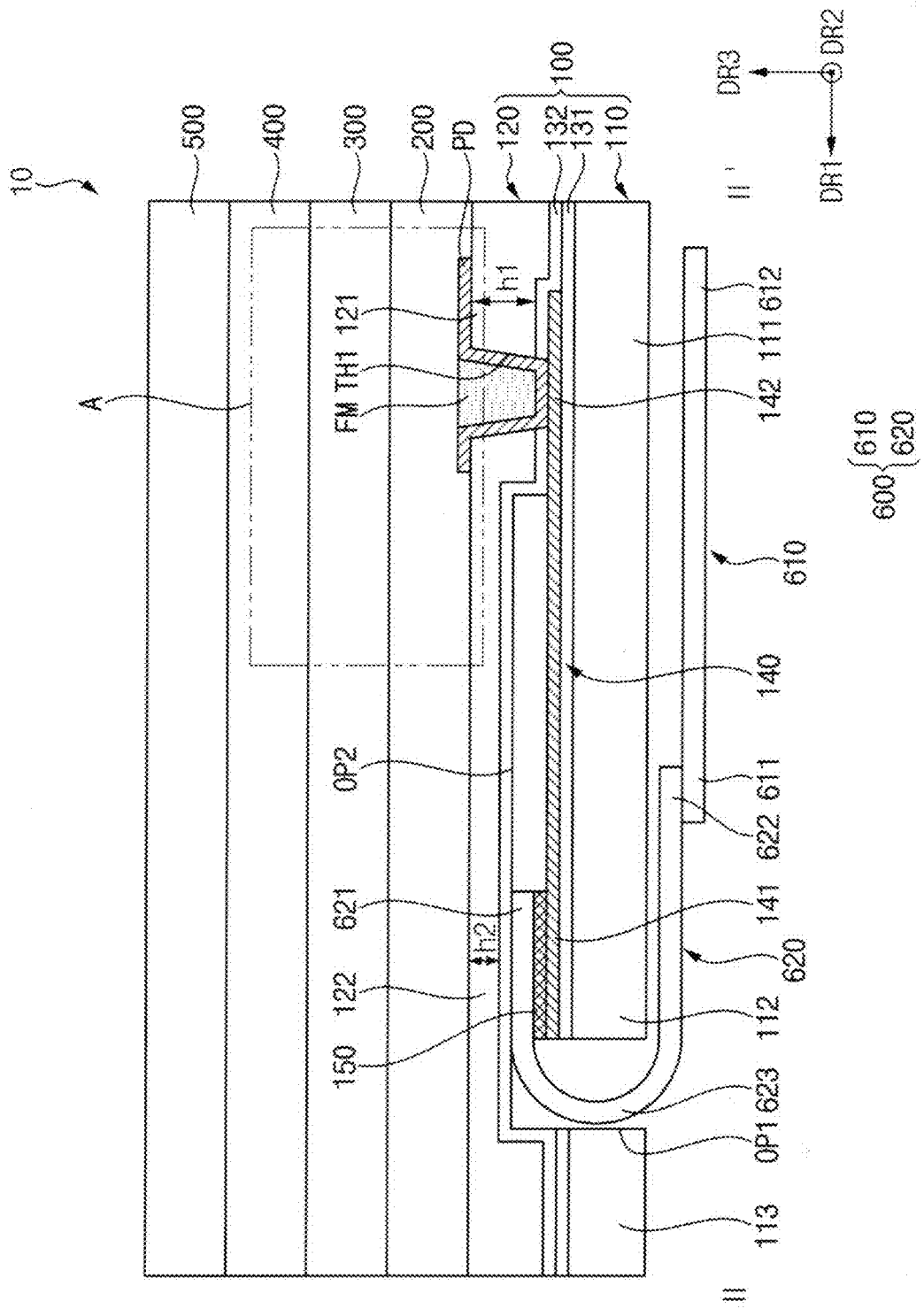
FIG. 5 is a cross-sectional view taken along line II-II' of FIG. 3.

FIG. 3 is a plan view illustrating a display device according to an embodiment. FIG. 4 is a cross-sectional view taken along line I-I' of FIG. 3. FIG. 5 is a cross-sectional view taken along line II-II' of FIG. 3. Particularly, the display device 10 of FIG. 3 may illustrate an embodiment of one of the first to ninth display devices 10a to 10i of FIG. 1.

Referring to FIGS. 3 to 5, an embodiment of the display device 10 may include a substrate layer 100, a thin film transistor layer 200, a light emitting element layer 300, an encapsulation layer 400, a protective film 500, and a driver 600.

The substrate layer 100 may include a first substrate 110, a second substrate 120, a first barrier layer 131, a second barrier layer 132, and a connection line 140.

The first substrate 110 may be a transparent insulating substrate. The first substrate 110 may be flexible and bendable. In one embodiment, for example, the first substrate 110 may include polyimide ("PI"), polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polycarbonate ("PC"), cellulose acetate propionate ("CAP"), or the like.

The connection line 140 may be disposed on the first substrate 110. The connection line 140 may include a conductive material such as a metal. The connection line 140 may electrically connect the thin film transistor and the driver 600. In one embodiment, for example, a second circuit board 620 may be connected to a first end portion 141 of the connection line 140, and a pad electrode PD may be connected to a second end portion 142 of the connection line 140 opposite to the first end portion 141.

The second substrate 120 may be disposed on the first substrate 110 and the connection line 140. The second substrate 120 may be disposed between the connection line 140 and the thin film transistor layer 200. In one embodiment, for example, the second substrate 120 may include a substantially same material as the first substrate 110.

The first barrier layer 131 and the second barrier layer 132 may be disposed between the first substrate 110 and the second substrate 120. The first barrier layer 131 may be disposed between the first substrate 110 and the connection line 140. The first barrier layer 131 may include an inorganic insulating material such as silicon oxide, silicon nitride, silicon oxynitride, or the like. The first barrier layer 131 may improve adhesion between the first substrate 110 and the connection line 140.

The second barrier layer 132 may be disposed between the connection line 140 and the second substrate 120. The second barrier layer 132 may include an inorganic insulating material. The second barrier layer 132 may improve adhesion between the second substrate 120 and the connection line 140.

The thin film transistor layer 200 may be disposed on the substrate layer 100. The thin film transistor layer 200 may include at least one thin film transistor electrically connected to the pad electrode PD. The light emitting element layer 300 may be disposed on the thin film transistor layer 200. The light emitting element layer 300 may include at least one light emitting element electrically connected to the thin film transistor. The encapsulation layer 400 may be disposed on the light emitting element layer 300. The protective film 500 may be disposed on the encapsulation layer 400. The thin film transistor layer 200, the light emitting element layer 300, and the encapsulation layer 400 will be described later in detail with reference to FIG. 9.

The pad electrode PD may be disposed between the first substrate 110 and the thin film transistor layer 200. The pad electrode PD may be disposed on the connection line 140. In an embodiment, the connection line 140 may be disposed between the first substrate 110 and the pad electrode PD. The pad electrode PD may be electrically connected to the connection line 140 and the thin film transistor. The pad electrode PD may include a conductive material such as a metal.

In an embodiment, a first through hole TH1 may be defined in the second substrate 120 to overlap the second end portion 142 of the connection line 140. The first through hole TH1 may be defined through the second substrate 120 and the second barrier layer 132 in a thickness direction thereof. The first through hole TH1 may expose at least a portion of the second end portion 142 of the connection line 140. The pad electrode PD may be disposed on the second substrate 120, and may be electrically connected to the second end portion 142 of the connection line 140 through the first through hole TH1. In one embodiment, for example, the pad electrode PD may directly contact the connection line 140.

In an embodiment, the pad electrode PD may extend into the first through hole TH1. In one embodiment, for example, as illustrated in FIG. 5, the pad electrode PD may cover a side surface and a bottom surface of the first through hole TH1.

In an embodiment, a filling member FM may be disposed inside the first through hole TH1. The filling member FM may contact the pad electrode PD. The filling member FM may compensate for a step difference by filling an inner space of the first through hole TH1. In one embodiment, for example, the filling member FM may include an organic material to easily fill the inner space of the first through hole TH1.

The driver 600 may include a first circuit board 610, the second circuit board 620, and a driving integrated circuit.

The first circuit board 610 may be disposed under the first substrate 110. The second circuit board 620 may electrically connect the first circuit board 610 and the connection line 140. In such an embodiment, the first circuit board 610 may be electrically connected to the thin film transistor through the second circuit board 620, the connection line 140, and the pad electrode PD.

A first end portion 621 of the second circuit board 620 may be connected to the connection line 140. In one embodiment, for example, the first end portion 621 of the second circuit board 620 may be bonded (may be attached) to the first end portion 141 of the connection line 140 by a conductive adhesive member 150. In one embodiment, for example, the conductive adhesive member 150 may be an anisotropic conductive film ("ACF").

A portion of the second circuit board 620 may be positioned between the first substrate 110 and the thin film transistor layer 200. In one embodiment, for example, the first end portion 621 of the second circuit board 620 may be positioned between the first substrate 110 and the thin film transistor layer 200. The first end portion 621 of the second circuit board 620 may be positioned between the connection line 140 and the second substrate 120. The first end portion 621 of the second circuit board 620 may be positioned between the connection line 140 and the second barrier layer 132.

A second end portion 622 of the second circuit board 620 opposite to the first end portion 621 may be connected to the first circuit board 610. In one embodiment, for example, the second end portion 622 of the second circuit board 620 may be bonded to the first end portion 611 of the first circuit board 610 by a conductive adhesive member (not illustrated). In one embodiment, for example, the second end portion 612 of the first circuit board 610 may be fixed on a lower surface of the first substrate 110, but embodiments are not limited thereto.

The second circuit board 620 (e.g., the second end portion 622 of the second circuit board 620) may be bent under the first substrate 110. In one embodiment, for example, the second circuit board 620 may have a bendable portion 623. The bendable portion 623 of the second circuit board 620 may be defined between the first end portion 621 and the second end portion 622 of the second circuit board 620. The second end portion 622 of the second circuit board 620 may be bent under the first substrate 110 by the bendable portion 623 of the second circuit board 620. In such an embodiment, the first end portion 621 of the second circuit board 620 may be positioned between the first substrate 110 and the second substrate 120, and the second end portion 622 of the second circuit board 620 may be positioned under the first substrate 110.

Although not illustrated in the drawings, the driving integrated circuit may be mounted on the first circuit board 610 and/or the second circuit board 620. In one embodiment, for example, the driving controller CON of FIG. 2 may be mounted on the first circuit board 610. In one embodiment, for example, the gate driver GDV and the data driver DDV of FIG. 2 may be mounted on the second circuit board 620. However, embodiments are not limited thereto.

Figure 6:
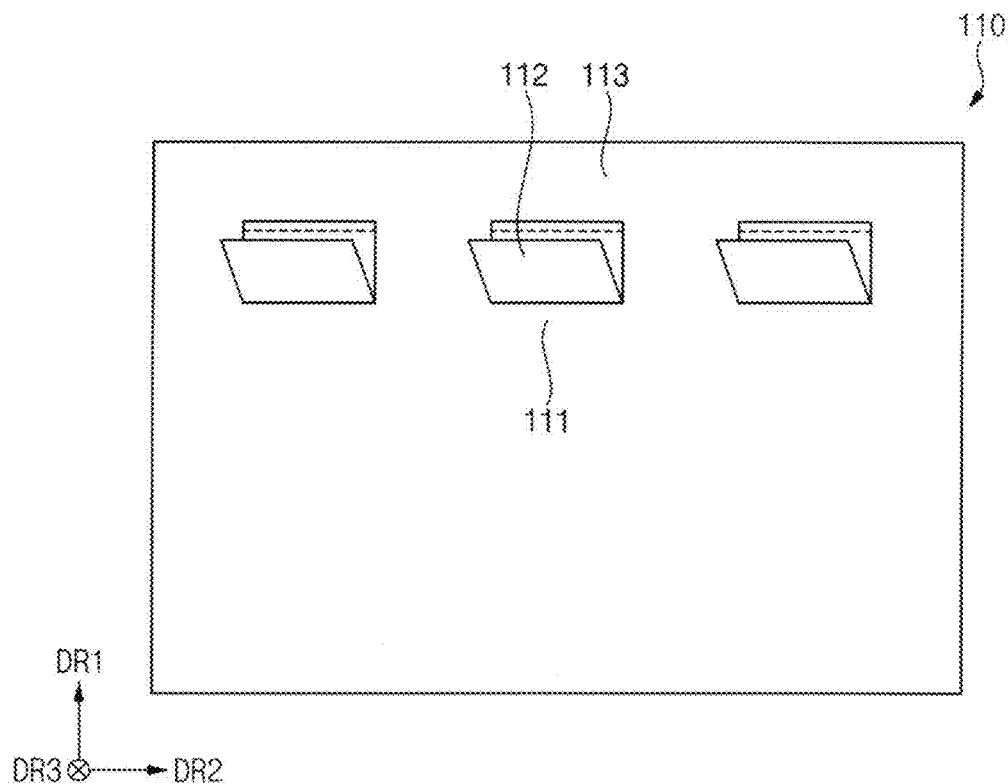
FIG. 6 is a bottom view illustrating an embodiment of a first substrate included in the display device of FIG. 3.

FIG. 6 is a bottom view illustrating an embodiment of a first substrate included in the display device of FIG. 3. Particularly, FIG. 6 may illustrate an inverted state of the first substrate 110 included in the display device 10 of FIG. 3.

Referring to FIGS. 3 to 6, in an embodiment, the first substrate 110 may include a first portion 111, a second portion 112, and a third portion 113.

The first portion 111 of the first substrate 110 may overlap the pad electrode PD. In such an embodiment, the first portion 111 of the first substrate 110 may overlap the second end portion 142 of the connection line 140. The first portion 111 of the first substrate 110 may be fixed to the second substrate 120. In such an embodiment, the first portion 111 of the first substrate 110 may not be peeled (or separated) from the second substrate 120.

The second portion 112 of the first substrate 110 may be positioned in the first direction DR1 from the first portion 111 of the first substrate 110. The second portion 112 of the first substrate 110 may overlap the first end portion 621 of the second circuit board 620. In an embodiment, the second portion 112 of the first substrate 110 may overlap the first end portion 141 of the connection line 140. In such an embodiment, the first end portion 621 of the second circuit board 620 may be bonded to the second portion 112 of the first substrate 110.

Figure 17:
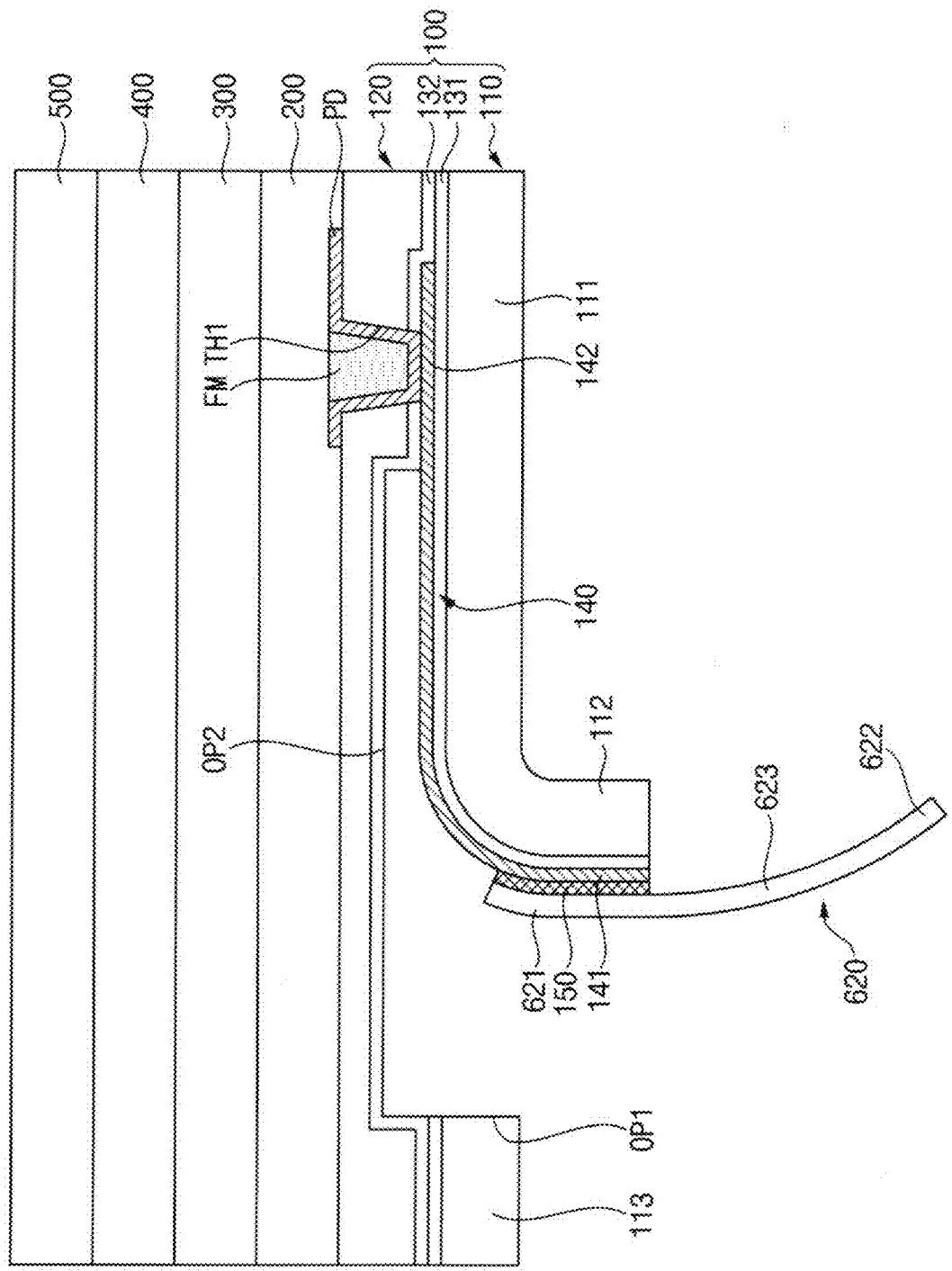

The second portion 112 of the first substrate 110 may be peeled from the second substrate 120. In one embodiment, for example, the second portion 112 of the first substrate 110 may be bent in a downward direction (e.g., in a direction opposite to the third direction DR3) when an external force is applied. In such an embodiment, as illustrated in FIG. 17, the second portion 112 of the first substrate 110 may be relatively far from the second substrate 120. In one embodiment, for example, the second portion 112 of the first substrate 110 may be restored to its original state when the external force is removed. In such an embodiment, the second portion 112 of the first substrate 110 bent in the downward direction may be smoothed in an upward direction (e.g., in the third direction DR3).

The first portion 111 and the second portion 112 of the first substrate 110 may be integrally formed as a single unitary unit. In such an embodiment, even if a portion of the first substrate 110 is bent and the second portion 112 is peeled from the second substrate 120, the first substrate 110 may not be completely peeled from the second substrate 120 by the first portion 111 of the first substrate 110 fixed to the second substrate 120.

In one embodiment, for example, as illustrated in FIG. 6, the first substrate 110 may have the plurality of second portions 112 arranged in the second direction DR2. Each second portion 112 of the first substrate 110 may overlap each driver (e.g., the driver 600 of FIG. 3). In such an embodiment, portions of the first substrate 110 respectively overlapping drivers may be peeled from the second substrate 120.

The third portion 113 of the first substrate 110 may be positioned in the first direction DR1 from the second portion 112 of the first substrate 110. In an embodiment, the third portion 113 of the first substrate 110 may be spaced apart from the first portion 111 of the first substrate 110 with the second portion 112 of the first substrate 110 interposed therebetween. The third portion 113 of the first substrate 110 may be fixed to the second substrate 120. In an embodiment, the third portion 113 of the first substrate 110 may not be peeled from the second substrate 120.

In an embodiment, the third portion 113 of the first substrate 110 may be spaced apart from the second portion 112 of the first substrate 110 in the first direction DR1. A first opening OP1 may be formed between the second portion 112 of the first substrate 110 and the third portion 113 of the first substrate 110. In an embodiment, the first opening OP1 may be defined as a space in which the third portion 113 of the first substrate 110 is spaced apart from the second portion 112 of the first substrate 110.

In one embodiment, for example, as illustrated in FIG. 5, the bendable portion 623 of the second circuit board 620 may be positioned in the first opening OP1. In an embodiment, the first opening OP1 may accommodate the bendable portion 623 of the second circuit board 620. In such an embodiment, the second portion 112 of the first substrate 110 may be easily peeled from the second substrate 120 by the first opening OP1.

Figure 7:
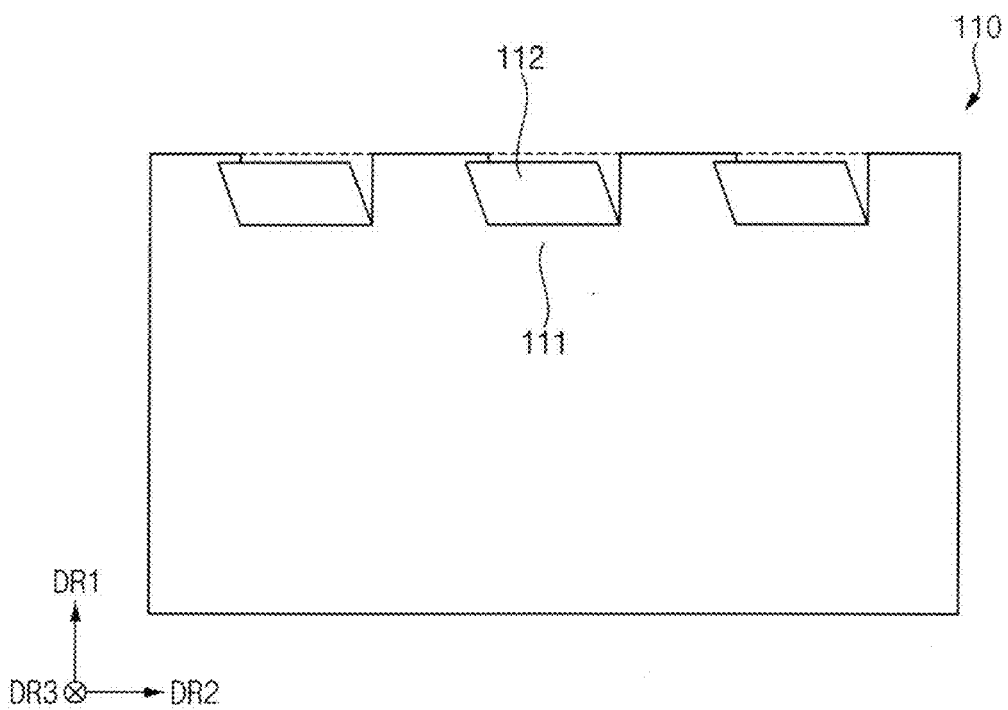
FIG. 7 is a bottom view illustrating an alternative embodiment of FIG. 6.

FIG. 7 is a bottom view illustrating an alternative embodiment of FIG. 6.

Referring to FIGS. 3, 4, 5 and 7, in an embodiment, the second portions 112 of the first substrate 110 may be positioned at an edge (e.g., a long side of the first direction DR1) of the first substrate 110. In such an embodiment, the third portion 113 of the first substrate 110 may be omitted. In such an embodiment, the bendable portion 623 of the second circuit board 620 may be positioned outside the first board 110.

Figure 8:
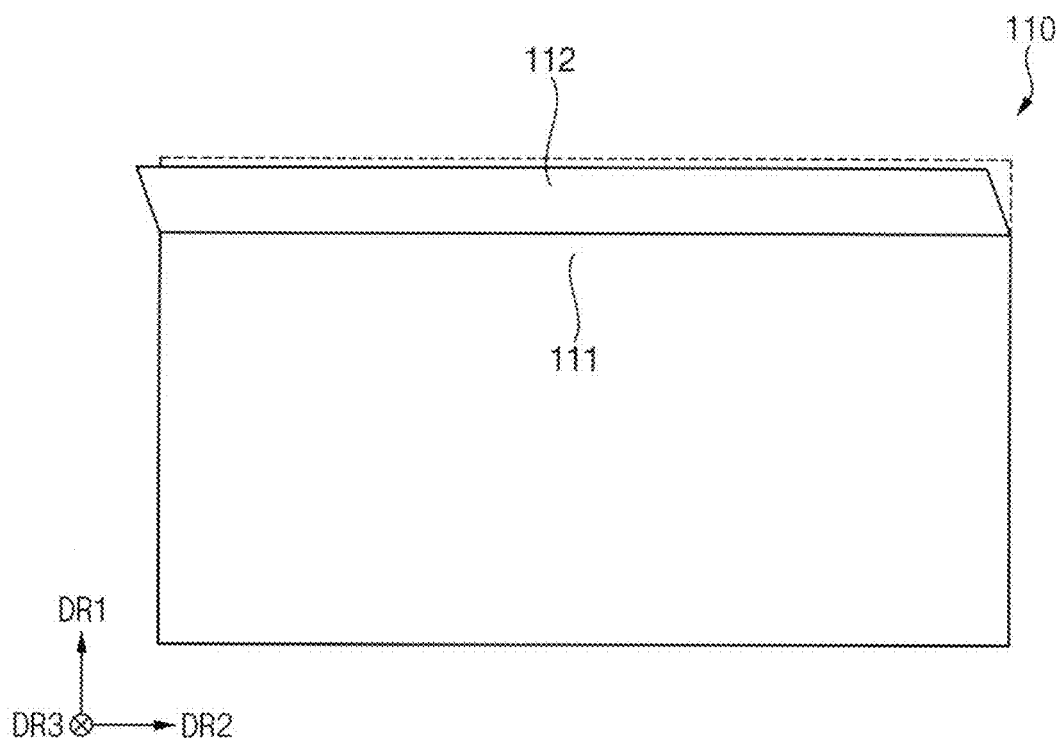
FIG. 8 is a bottom view illustrating another alternative embodiment of FIG. 6.

FIG. 8 is a bottom view illustrating another alternative embodiment of FIG. 6.

Referring to FIGS. 3, 4, 5 and 8, in an embodiment, the first substrate 110 may have the second portion 112 extending in the second direction DR2. The second portion 112 of the first substrate 110 may overlap the drivers 600 arranged in the second direction DR2. In such an embodiment, a portion of the first substrate 110 extending in the direction in which the drivers 600 are arranged may be peeled from the second substrate 120. In FIG. 8, the second portion 112 is illustrated as being positioned at an edge of the first substrate 110, but alternatively, the second portion 112 may be positioned inside the first substrate 110 as illustrated in FIG. 6.

Referring back to FIGS. 3 to 5, in an embodiment, the second substrate 120 may include a first portion 121 and a second portion 122.

The first portion 121 of the second substrate 120 may overlap the pad electrode PD. In an embodiment, the first portion 121 of the second substrate 120 may overlap the second end portion 142 of the connection line 140. The first portion 121 of the second substrate 120 may have a first height h1 in the third direction DR3.

The second portion 122 of the second substrate 120 may be positioned in the first direction DR1 from the first portion 121 of the second substrate 120. The second portion 122 of the second substrate 120 may overlap the first end portion 621 of the second circuit board 620. In an embodiment, the second portion 122 of the second substrate 120 may overlap the first end portion 141 of the connection line 140. The second portion 122 of the second substrate 120 may have a second height h2 in the third direction DR3.

In an embodiment, the second substrate 120 may have a generally flat upper surface. In such an embodiment, the first height h1 may be greater than the second height h2. In such an embodiment, a step difference may occur between a lower surface of the first portion 121 of the second substrate 120 and a lower surface of the second portion 122 of the second substrate 120.

The second barrier layer 132 may cover the second substrate 120 under a lower surface of the second substrate 120. In one embodiment, for example, the second barrier layer 132 may have a substantially uniform thickness along a profile of the second substrate 120.

In an embodiment, the first end portion 141 of the connection line 140 may be spaced apart from the second barrier layer 132. The second end portion 142 of the connection line 140 may contact the second barrier layer 132. In one embodiment, for example, the first end portion 141 of the connection line 140 may contact the conductive adhesive member 150.

A second opening OP2 may be defined between the first end portion 141 of the connection line 140 and the second barrier layer 132 due to the step difference between a lower surface of the first portion 121 of the second substrate 120 and a lower surface of the second portion 122 of the second substrate 120. In an embodiment, the second opening OP2 may be defined as a space in which the second barrier layer 132 is spaced apart from the connection line 140. The first end portion 621 of the second circuit board 620 may be positioned in the second opening OP2.

Figure 9:
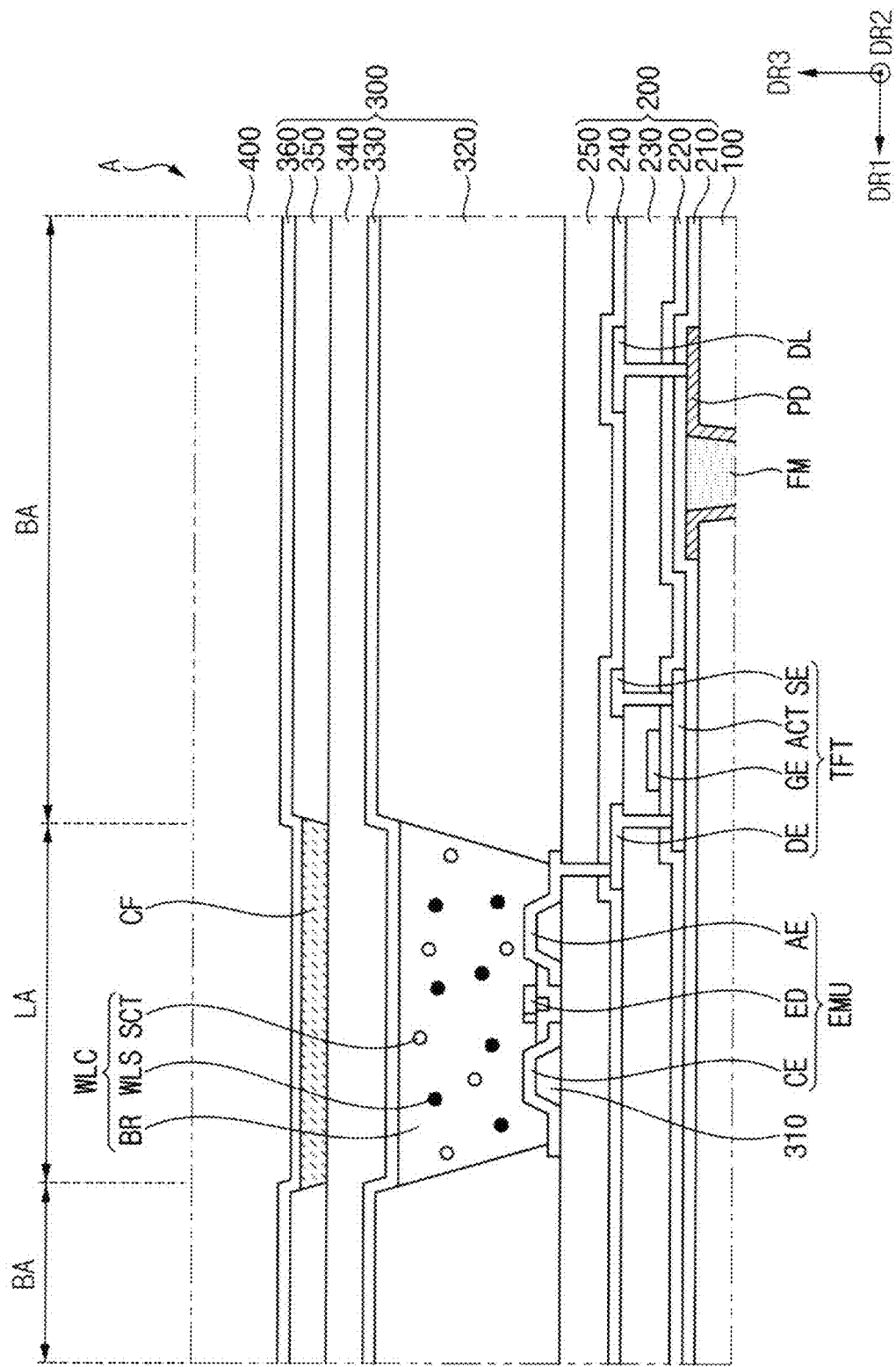
FIG. 9 is an enlarged cross-sectional view of an area 'A' of FIG. 5.

FIG. 9 is an enlarged cross-sectional view of an area 'A' of FIG. 5.

Referring to FIGS. 5 and 9, in an embodiment, the thin film transistor layer 200 may include the thin film transistor TFT, a buffer layer 210, a gate insulating layer 220, an interlayer insulating layer 230, a first passivation layer 240, and a first planarization layer 250. The thin film transistor TFT may include an active layer ACT, a gate electrode GE, a source electrode SE, and a drain electrode DE.

The buffer layer 210 may be disposed on the substrate layer 100. In one embodiment, for example, the buffer layer 210 may be disposed on the second substrate 120. The buffer layer 210 may cover the pad electrode PD. The buffer layer 210 may include an inorganic insulating material. The buffer layer 210 may prevent or reduce penetration of foreign substances from the substrate layer 100 into the active layer ACT.

The active layer ACT may be disposed on the buffer layer 210. In one embodiment, for example, the active layer ACT may include a silicon semiconductor, an oxide semiconductor, or the like. The silicon semiconductor may include amorphous silicon, polycrystalline silicon, or the like. The active layer ACT may include a source area, a drain area, and a channel area. Each of the source area and the drain area may be doped with impurities. The channel area may be disposed between the source area and the drain area.

The gate insulating layer 220 may be disposed on the buffer layer 210. The gate insulating layer 220 may cover the active layer ACT. The gate insulating layer 220 may include an inorganic insulating material.

The gate electrode GE may be disposed on the gate insulating layer 220. The gate electrode GE may overlap the channel area of the active layer ACT. The gate electrode GE may include a metal, an alloy, a conductive metal oxide, a conductive metal nitride, a transparent conductive material, or the like. In one embodiment, for example, the gate electrode GE may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), or the like.

The interlayer insulating layer 230 may be disposed on the gate insulating layer 220. The interlayer insulating layer 230 may cover the gate electrode GE. The interlayer insulating layer 230 may include an inorganic insulating material.

The source electrode SE and the drain electrode DE may be disposed on the interlayer insulating layer 230. The source electrode SE and the drain electrode DE may be connected to the source area and the drain area of the active layer ACT through contact holes, respectively. Each of the source electrode SE and the drain electrode DE may include a metal, an alloy, a conductive metal oxide, a conductive metal nitride, a transparent conductive material, or the like. The active layer ACT, the gate electrode GE, the source electrode SE, and the drain electrode DE may collectively define the thin film transistor TFT.

The data line DL may be disposed on the interlayer insulating layer 230. The data line DL may include a metal, an alloy, a conductive metal oxide, a conductive metal nitride, a transparent conductive material, or the like. The data line DL may electrically contact the pad electrode PD through a contact hole defined in the buffer layer 210, the gate insulating layer 220, and the interlayer insulating layer 230. The data line DL may receive the data signal generated by the data driver DDV through the pad electrode PD. In one embodiment, for example, the data line DL may be electrically connected to the source electrode SE, and may transmit the data signal to the source electrode SE.

Although an embodiment in which the data line DL contacts the pad electrode PD is illustrated in FIG. 9, the pad electrode PD may contact a gate line, a power transmission line, an initialization voltage line, or the like. Each of the gate line, the power transmission line, and the initialization voltage line may be disposed on the buffer layer 210, on the gate insulating layer 220, or on the interlayer insulating layer 230.

The first passivation layer 240 may cover the thin film transistor TFT. The first passivation layer 240 may protect the thin film transistor TFT.

The first planarization layer 250 may be disposed on the first passivation layer 240. The first planarization layer 250 may have a substantially flat upper surface without generating a step difference around the thin film transistor TFT.

The first planarization layer 250 may include an organic insulating material. In one embodiment, for example, the first planarization layer 250 may include a photoresist, a polyacryl-based resin, a polyimide-based resin, a polyamide-based resin, a siloxane-based resin, an acryl-based resin, an epoxy-based resin, or the like.

The light emitting element layer 300 may be disposed on the thin film transistor layer 200. In an embodiment, the light emitting element layer 300 may include a light emitting unit EMU, a first bank 310, a second bank 320, a wavelength conversion part WLC, a second passivation layer 330, a second planarization layer 340, a light blocking layer 350, a color filter layer CF, and a third passivation layer 360. The light emitting unit EMU may include a first electrode AE, a second electrode CE, and a light emitting element ED. Although one light emitting area LA is illustrated in FIG. 9, first to third light emitting areas may be repeatedly disposed in the display device 10. The first to third light emitting areas may respectively emit light having different colors from each other. In one embodiment, for example, the first light emitting area may emit red light, the second light emitting area may emit green light, and the third light emitting area may emit blue light. In an embodiment, the light blocking area BA may have a relatively wide width as shown in FIG. 9. Alternatively, the light blocking area BA may have a relatively narrow width.

The first bank 310 and the second bank 320 may be disposed on the first planarization layer 250. An opening may be defined through the second bank 320 to expose the light emitting area LA. In one embodiment, for example, the second bank 320 may surround the light emitting area LA in a plan view. In such an embodiment, the light emitting area LA may be defined by the second bank 320. The second bank 320 may include an organic insulating material. The second bank 320 may further include a light blocking material to prevent color mixing between adjacent light emitting areas LA.

The first bank 310 may be disposed in the opening of the second bank 320. In an embodiment, the first bank 310 may overlap the light emitting area LA. Each of the first bank 310 and the second bank 320 may include an organic insulating material.

The first electrode AE may be disposed on the first planarization layer 250. The first electrode AE may overlap the light emitting area LA and cover the first bank 310. The first electrode AE may be electrically connected to the drain electrode DE through a contact hole defined in the first passivation layer 240 and the first planarization layer 250.

The second electrode CE may be disposed on the first planarization layer 250. The second electrode CE may overlap the light emitting area LA and cover the first bank 310. In one embodiment, for example, the second electrode CE may receive a common voltage applied to the pixels. The first electrode AE and the second electrode CE may be insulated from each other by an insulating layer covering a portion of the first electrode AE and a portion of the second electrode CE adjacent to each other.

The light emitting element ED may be disposed on the first planarization layer 250 between the first electrode AE and the second electrode CE. The light emitting element ED may be disposed on the insulating layer. An end of the light emitting element ED may be connected to the first electrode AE, and another end of the light emitting element ED may be connected to the second electrode CE. In one embodiment, for example, the light emitting element ED may include an active layer having a same material as each other to emit light of a same wavelength band or light of a same color. In one embodiment, for example, the light emitting element ED may emit blue light having a peak wavelength in range of about 440 nanometers (nm) to 480 nm.

When the light emitting area LA is the first light emitting area or the second light emitting area (e.g., when the light emitting area LA emits red light or green light), the wavelength conversion part WLC may be disposed on the light emitting unit EMU. The wavelength conversion part WLC may be surrounded by the second bank 320. The wavelength conversion part WLC may include a base resin BR, a scatterer SCT, and a wavelength shifter WLS.

The base resin BR may include a material having a relatively high light transmittance. The base resin BR may be formed of a transparent organic material. In one embodiment, for example, the base resin BR may include an epoxy-based resin, an acrylic resin, a cardo-based resin, an imide-based resin, or the like.

The scatterer SCT may have a refractive index different from the base resin BR, and may form an optical interface with the base resin BR.

The wavelength shifter WLS may convert or shift a peak wavelength of an incident light into a predetermined peak wavelength. In one embodiment, for example, the wavelength shifter WLS may convert blue light into red light or green light and emit the converted light. The wavelength shifter WLS may include quantum dots, quantum rods, or a phosphor. The quantum dots may be a particulate material that emits light of a particular color in response to the transition of electrons from a conduction band to a valance band.

Light emitted by the wavelength shifter WLS may have a full width at half maximum of about 45 nm or less, about 40 nm or less, or about 30 nm or less. Accordingly, a color reproducibility of the display device 10 may be improved.

When the light emitting area LA is the third light emitting area (e.g., when the light emitting area LA emits blue light), a transmission part may be disposed on the light emitting unit EMU. The transmission part may be surrounded by the second bank 320. The transmission part may include the base resin BR and the scatterer SCT, and may not include the wavelength shifter WLS. The transmission part may transmit the blue light emitted from the light emitting element ED without converting the wavelength.

The second passivation layer 330 may cover the wavelength conversion part WLC and the second bank 320. The second passivation layer 330 may protect the wavelength conversion part WLC and the second bank 320.

The second planarization layer 340 may be disposed on the second passivation layer 330. The second planarization layer 340 may have a substantially flat upper surface without generating a step difference around the wavelength conversion part WLC. The second planarization layer 340 may include an organic insulating material.

The light blocking layer 350 may be disposed on the second planarization layer 340. The light blocking layer 350 may overlap the second bank 320. An opening may be defined through the light blocking layer 350 to overlap the light emitting area LA.

The color filter layer CF may be disposed in the light emitting area LA on the second planarization layer 340. The color filter layer CF may be disposed in the opening of the light blocking layer 350. In one embodiment, for example, the color filter layer CF may be surrounded by the light blocking layer 350 in a plan view. The color filter layer CF may selectively transmit light having a specific color and block or absorb light having a color different from the specific color.

The third passivation layer 360 may cover the color filter layer CF and the light blocking layer 350. The third passivation layer 360 may protect the color filter layer CF and the light blocking layer 350.

The encapsulation layer 400 may be disposed on the third passivation layer 360. In one embodiment, for example, the encapsulation layer 400 may include at least one inorganic layer to prevent penetration of oxygen or moisture into the light emitting element layer 300 and the thin film transistor layer 200. In addition, the encapsulation layer 400 may include at least one organic layer to protect the light emitting element layer 300 and the thin film transistor layer 200 from foreign substances such as dust.

In an embodiment, the driver 600 may be disposed under the substrate layer 100. The driver 600 may be connected to the pad electrode PD through the connection line 140 disposed inside the substrate layer 100. Accordingly, a dead space of the display device 10 may be reduced. In such an embodiment, external visibility of a boundary between adjacent display devices 10 among the display devices 10 (e.g., the first to ninth display devices 10a to 10i of FIG. 1) included in the tiled display device TD may be substantially reduced. Accordingly, a display quality of the tiled display device TD may be improved.

In an embodiment, the substrate layer 100 included in the display device 10 may include the first substrate 110 and the second substrate 120. The first portion 111 of the first substrate 110 may be fixed to the second substrate 120, and the second portion 112 of the first substrate 110 may be peeled from the second substrate 120. The second circuit board 620 may be bonded on the second portion 112 of the first substrate 110 (i.e., on the first end portion 141 of the connection line 140). In an embodiment, as illustrated in FIG. 17, a bonding process of the second circuit board 620 to the connection line 140 may be performed in a state in which the second portion 112 of the first substrate 110 is peeled from the second substrate 120. Accordingly, the display device 10 may prevent or reduce damage to the second substrate 120, the thin film transistor, and the light emitting element disposed on the second substrate 120 from heat or pressure applied to a bonding area (i.e., the second portion 112 of the first substrate 110) during the bonding process. In such an embodiment, since the bonding process is performed in the state in which the second portion 112 of the first substrate 110 is peeled from the second substrate 120, bonding apparatuses having various sizes may be used. In such an embodiment, the display device 10 may reduce or minimize the front visibility of an area in which the second circuit board 620 is bonded.

Figure 10:
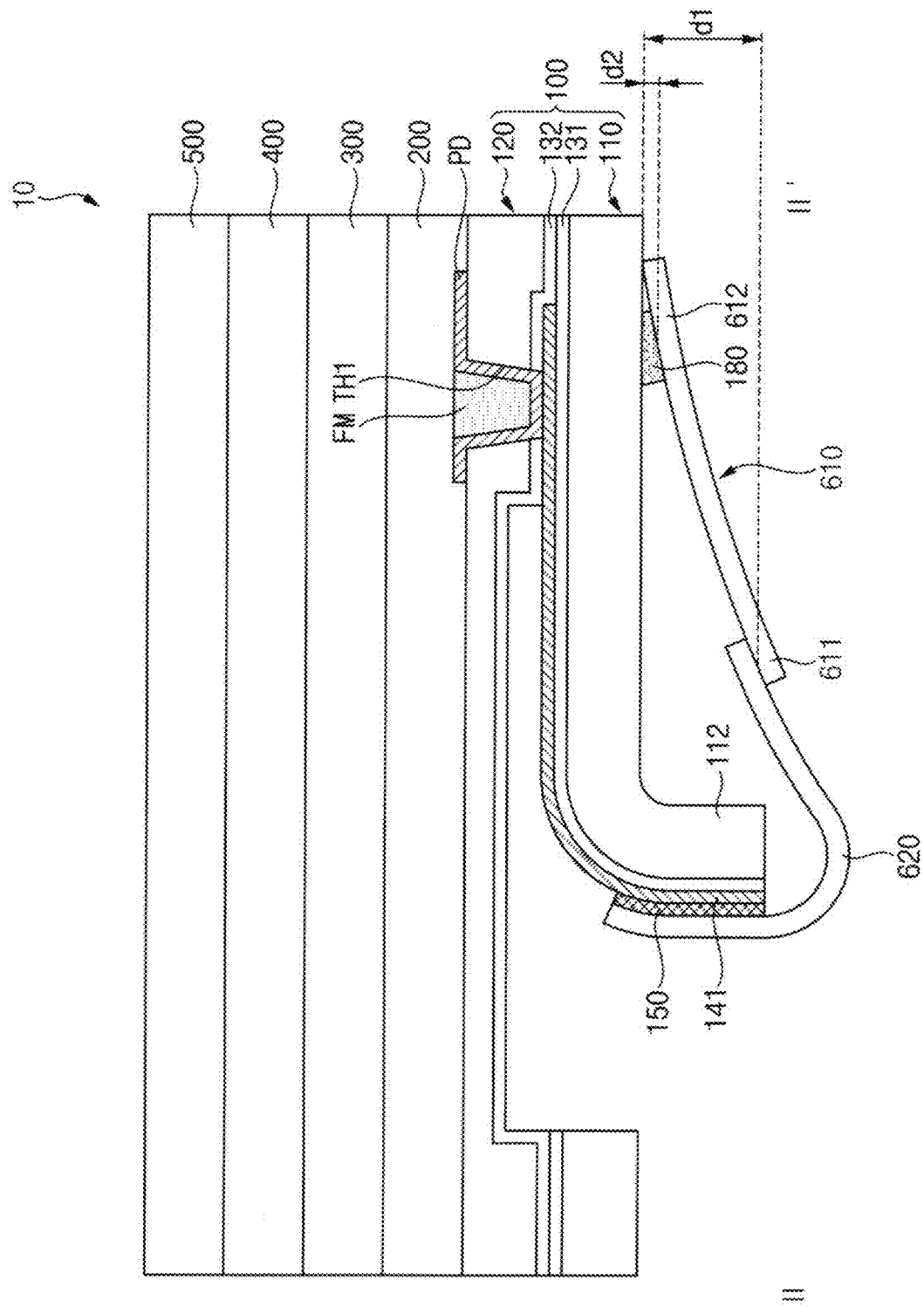
FIG. 10 is a cross-sectional view illustrating an alternative embodiment taken along line II-II' of FIG. 3.

FIG. 10 is a cross-sectional view illustrating an alternative embodiment taken along line II-II' of FIG. 3.

Referring to FIG. 10, in an embodiment, the display device 10 may further include a fixing member 180 disposed under the first substrate 110. The fixing member 180 may fix the second end portion 612 of the first circuit board 610 to the lower surface of the first substrate 110.

In an embodiment, the fixing member 180 may fix the first circuit board 610 to the lower surface of the first substrate 110 so that the state in which the second portion 112 of the first substrate 110 is peeled from the second substrate 120 may be maintained.

In one embodiment, for example, a first distance d1 between the first substrate 110 and the first end portion 611 of the first circuit board 610 may be greater than a second distance d2 between the first substrate 110 and the second end portion 612 of the first circuit board 610.

In such an embodiment, the fixing member 180 may pull the second circuit board 620 bonded to the first circuit board 610 and the first end portion 141 of the connection line 140 bonded to the second circuit board 620 through the first circuit board 610, so that a gap between the second substrate 120 and the connection line 140 (e.g., the first end portion 141 of the connection line 140) may be relatively large. Accordingly, damage to the connection line 140 may be minimized.

FIGS. 11 to 18 are cross-sectional views illustrating a method of manufacturing a display device according to an embodiment. More particularly, FIGS. 11 to 18 show an embodiment of the method of manufacturing an embodiment of the display device described above with reference to FIGS. 3 to 6.

Figure 11:
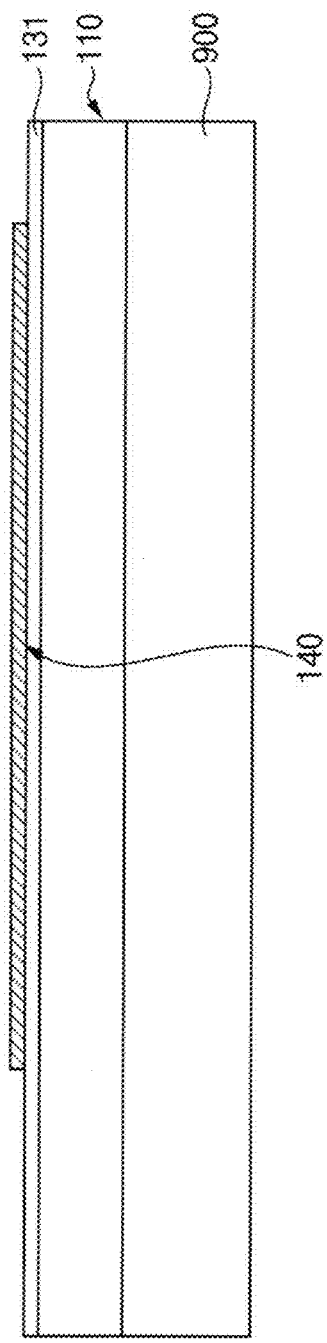
FIGS. 11 to 18 are cross-sectional views illustrating a method of manufacturing a display device according to an embodiment.

Referring to FIG. 11, the first substrate 110 may be provided or formed on a carrier substrate 900. The first substrate 110 may include or be formed of a material having flexibility to enable bending. In one embodiment, for example, the first substrate 110 may be formed using polyimide.

The first barrier layer 131 may be provided or formed on the first substrate 110. In one embodiment, for example, the first barrier layer 131 may be formed using an inorganic insulating material.

The connection line 140 may be provided or formed on the first substrate 110. The connection line 140 may be formed on the first barrier layer 131. The connection line 140 may be formed using a conductive material such as a metal.

Figure 12:
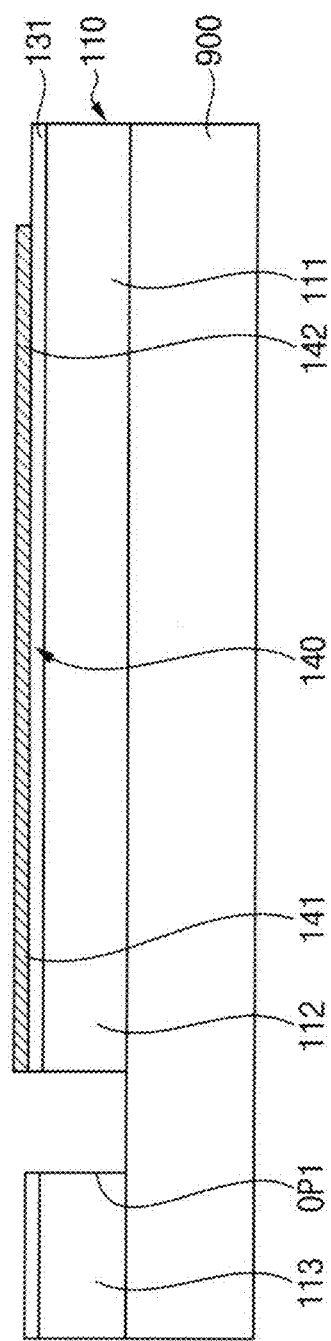

Referring to FIG. 12, the first opening OP1 may be formed in the first substrate 110. The first opening OP1 may be formed through the first substrate 110 and the first barrier layer 131 in a thickness direction thereof. In one embodiment, for example, the first opening OP1 may be formed to be adjacent to the first end portion 141 of the connection line 140. The first opening OP1 may be formed by various processes such as a dry etching process, a wet etching process, a laser drilling process, or the like.

Figure 13:
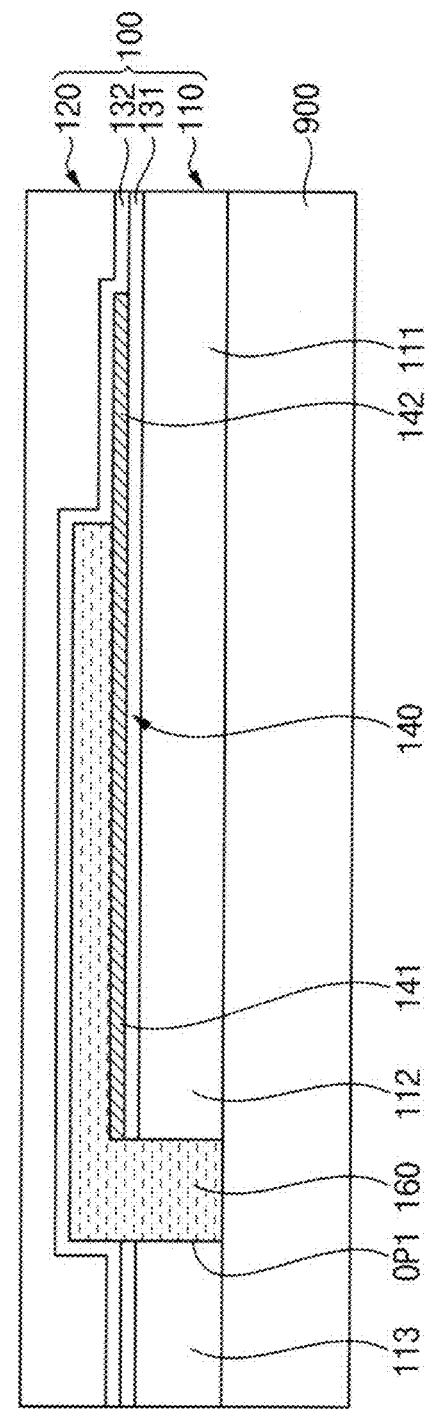

Referring to FIG. 13, an organic layer 160 may be provided or formed on the first substrate 110. The organic layer 160 may cover the first opening OP1 and a portion of the connection line 140. In one embodiment, for example, the organic layer 160 may cover the first end portion 141 of the connection line 140 adjacent to the first opening OP1. The organic layer 160 may expose the second end portion 142 of the connection line 140.

In an embodiment, the organic layer 160 may be formed using an organic material soluble in water, an organic solvent, or the like. The organic layer 160 may be formed using a material different from the first substrate 110 and the second substrate 120. The organic layer 160 may be formed by various processes such as a photolithography process, an inkjet printing process, or the like.

The second barrier layer 132 may be provided or formed on the first substrate 110. The second barrier layer 132 may cover the first barrier layer 131, the connection line 140, and the organic layer 160. The second barrier layer 132 may be formed using an inorganic insulating material. In one embodiment, for example, the second barrier layer 132 may be formed using a substantially same material as the first barrier layer 131.

The second substrate 120 may be provided or formed on the second barrier layer 132. The second substrate 120 may cover the second barrier layer 132, the connection line 140, and the organic layer 160. In one embodiment, for example, the second substrate 120 may have a substantially flat upper surface. In one embodiment, for example, the second substrate 120 may be formed using a substantially same material as the first substrate 110.

Figure 14:
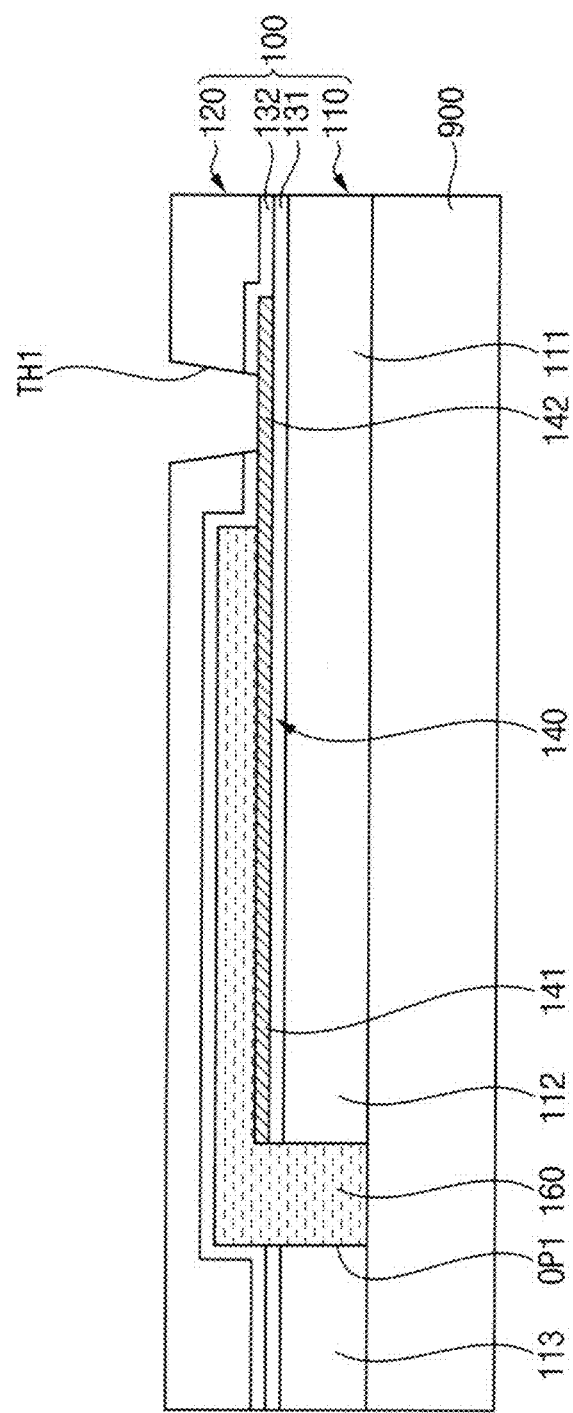

Referring to FIG. 14, the first through hole TH1 may be formed in the second substrate 120. The first through hole TH1 may be formed through the second substrate 120 and the second barrier layer 132 in a thickness direction thereof. The first through hole TH1 may overlap the second end portion 142 of the connection line 140. The first through hole TH1 may expose at least a portion of the second end portion 142 of the connection line 140. The first through hole TH1 may be formed by various processes such as a dry etching process, a wet etching process, a laser drilling process, or the like.

Figure 15:
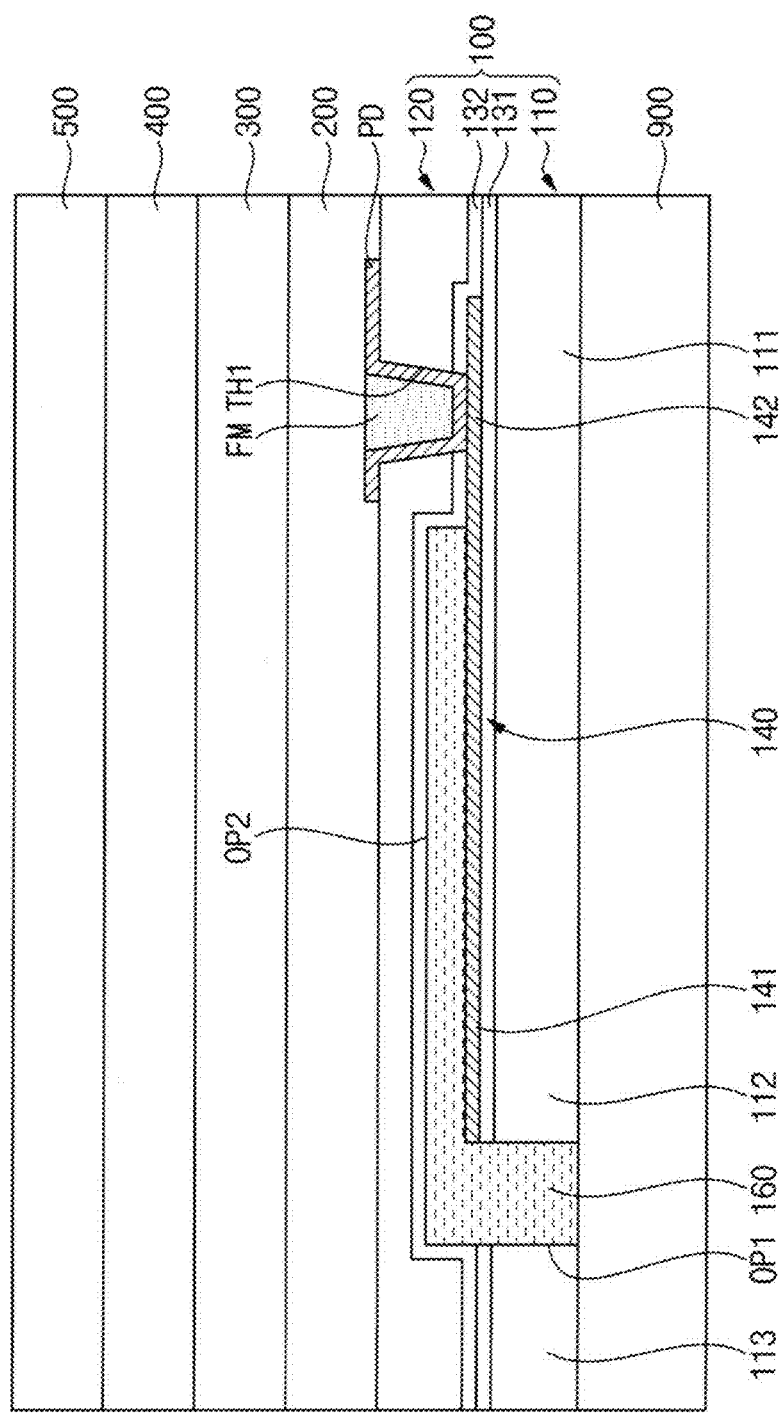

Referring to FIG. 15, the pad electrode PD may be provided or formed on the second substrate 120. The pad electrode PD may be electrically connected to the second end portion 142 of the connection line 140 through the first through hole TH1. In one embodiment, for example, the pad electrode PD may directly contact the second end portion 142 of the connection line 140. The pad electrode PD may be formed using a conductive material such as a metal. In one embodiment, for example, the pad electrode PD may extend into the first through hole TH1. In such an embodiment, the pad electrode PD may cover the side surface and the bottom surface of the first through hole TH1.

In an embodiment, the filling member FM may be formed by filling the inside of the first through hole TH1 with an organic material. The filling member FM may contact the pad electrode PD. The filling member FM may compensate for the step difference by filling the inner space of the first through hole TH1. In an alternative embodiment, the filling member FM may be omitted.

The thin film transistor layer 200, the light emitting element layer 300, the encapsulation layer 400, and the protective film 500 may be sequentially provided or formed on the second substrate 120 and the pad electrode PD.

Figure 16:
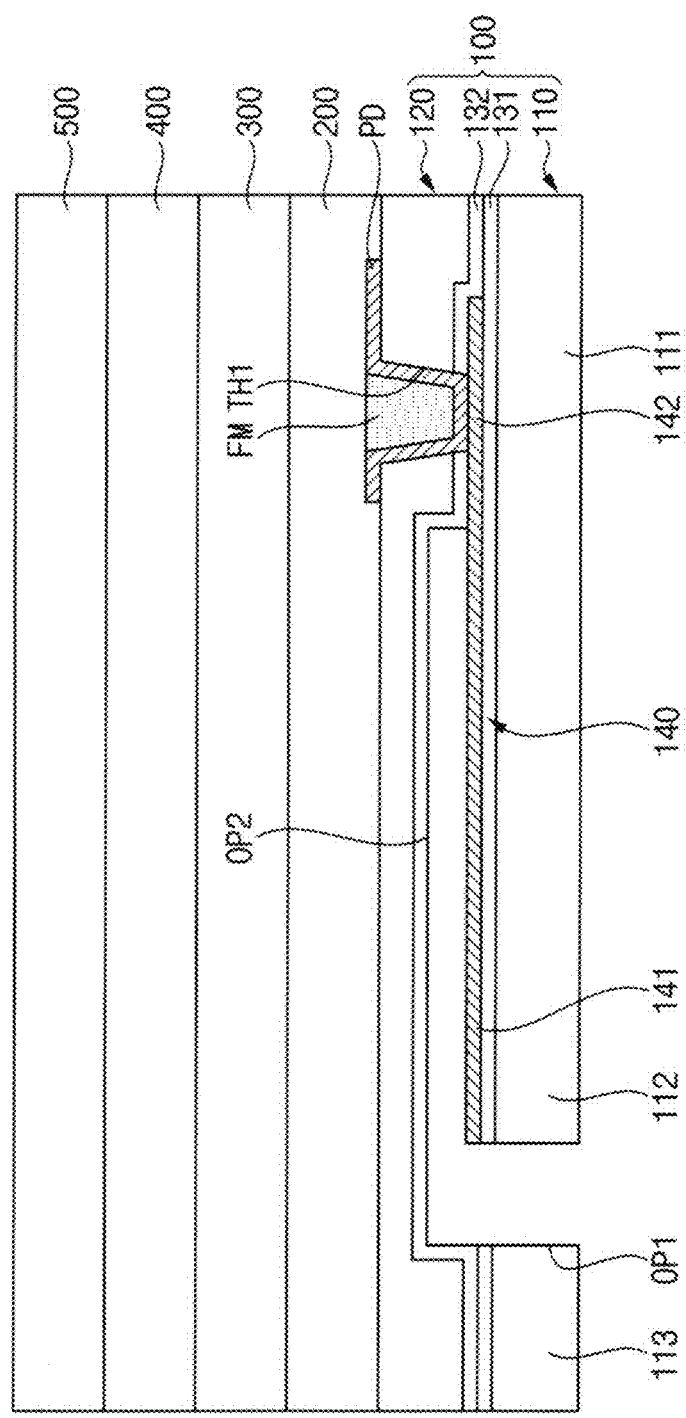

Referring to FIG. 16, the carrier substrate 900 may be separated from the first substrate 110.

After the carrier substrate 900 is separated from the first substrate 110, the organic layer 160 may be removed. In one embodiment, for example, the organic layer 160 may be removed using a solvent that dissolves the organic material constituting the organic layer 160. In one embodiment, for example, the solvent may not damage components other than the organic layer 160 (e.g., the first substrate 110, the second substrate 120, the connection line 140, or the like). In such an embodiment, the solvent may have a high selectivity with respect to the organic material constituting the organic layer 160. As the organic layer 160 is removed, the second opening OP2 may be formed between the first end portion 141 of the connection line 140 and the second barrier layer 132.

Referring to FIG. 17, the second portion 112 of the first substrate 110 may be peeled from the second substrate 120. In this case, the first portion 111 of the first substrate 110 may be maintained in a fixed state to the second substrate 120. In one embodiment, for example, the second portion 112 of the first substrate 110 may be bent in the downward direction by an external force. In such an embodiment, the first barrier layer 131 and the connection line 140 (e.g., the first end portion 141 of the connection line 140) disposed on the second portion 112 of the first substrate 110 may be bent in the downward direction together with the first substrate 110.

The second circuit board 620 may be bonded to the connection line 140. In one embodiment, for example, the first end portion 621 of the second circuit board 620 may be bonded to the first end portion 141 of the connection line 140 through the conductive adhesive member 150. In such an embodiment, after the conductive adhesive member 150 and the first end portion 621 of the second circuit board 620 is disposed on the first end portion 141 of the connection line 140, and the second circuit board 620 may be bonded to the connection line 140 by applying heat and pressure. The second circuit board 620 may be electrically connected to the thin film transistor disposed in the thin film transistor layer 200 through the connection line 140 and the pad electrode PD.

As described above, in an embodiment of the method of manufacturing the display device 10, the second circuit board 620 may be bonded to the connection line 140 by peeling the second portion 112 of the first substrate 110 from the second substrate 120 while the first portion 111 of the first substrate 110 is fixed to the second substrate 120. Accordingly, damage to the second substrate 120, the thin film transistor, and the light emitting element disposed on the second substrate 120 due to heat or pressure applied to the bonding area (i.e., the second portion 112 of the first substrate 110) may be effectively prevented or reduced during the bonding process of the second circuit board 620 to the connection line 140. In such an embodiment, since the bonding process is performed in the state in which the second portion 112 of the first substrate 110 is peeled from the second substrate 120, bonding apparatuses having various sizes may be used.

Figure 18:
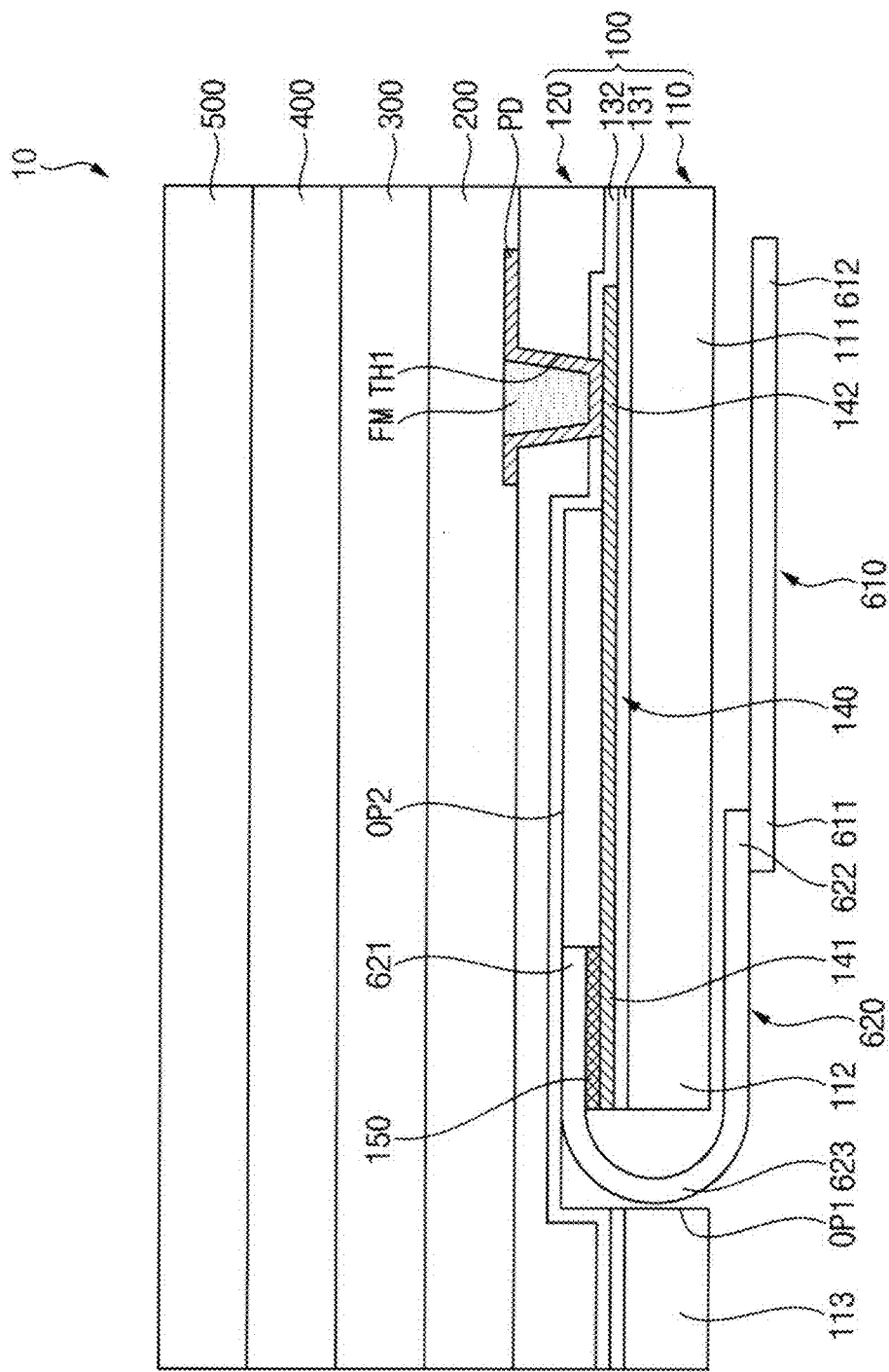

Referring to FIG. 18, the second portion 112 of the first substrate 110 may be restored to its original state. That is, the second portion 112 of the first substrate 110 bent in the downward direction may be moved in the upward direction. In one embodiment, for example, the second portion 112 of the first substrate 110 may be restored to its original state by stop applying the external force.

When the second portion 112 of the first substrate 110 is restored to its original state, the second circuit board 620 may be bent. That is, the first end portion 621 of the second circuit board 620 may be positioned between the first substrate 110 and the second substrate 120. The second end portion 622 of the second circuit board 620 may be bent in the downward direction by the bendable portion 623 of the second circuit board 620 to be positioned under the first substrate 110.

The first circuit board 610 may be bonded to the second circuit board 620. The first end portion 611 of the first circuit board 610 may be bonded to the second end portion 622 of the second circuit board 620 through a conductive adhesive member (not illustrated).

In an embodiment, the bonding process of the first circuit board 610 to the second circuit board 620 may be performed before or after the second portion 112 of the first substrate 110 is restored to its original state. In an embodiment, although not illustrated in the drawings, the first circuit board 610 disposed under the first substrate 110 may be fixed to the lower surface of the first substrate 110 by a fixing member or a lower protective film disposed under the lower surface of the first substrate 110. In one embodiment, for example, the lower protection film may be entirely disposed under the display device 10 to protect the display device 10.

Figure 19:
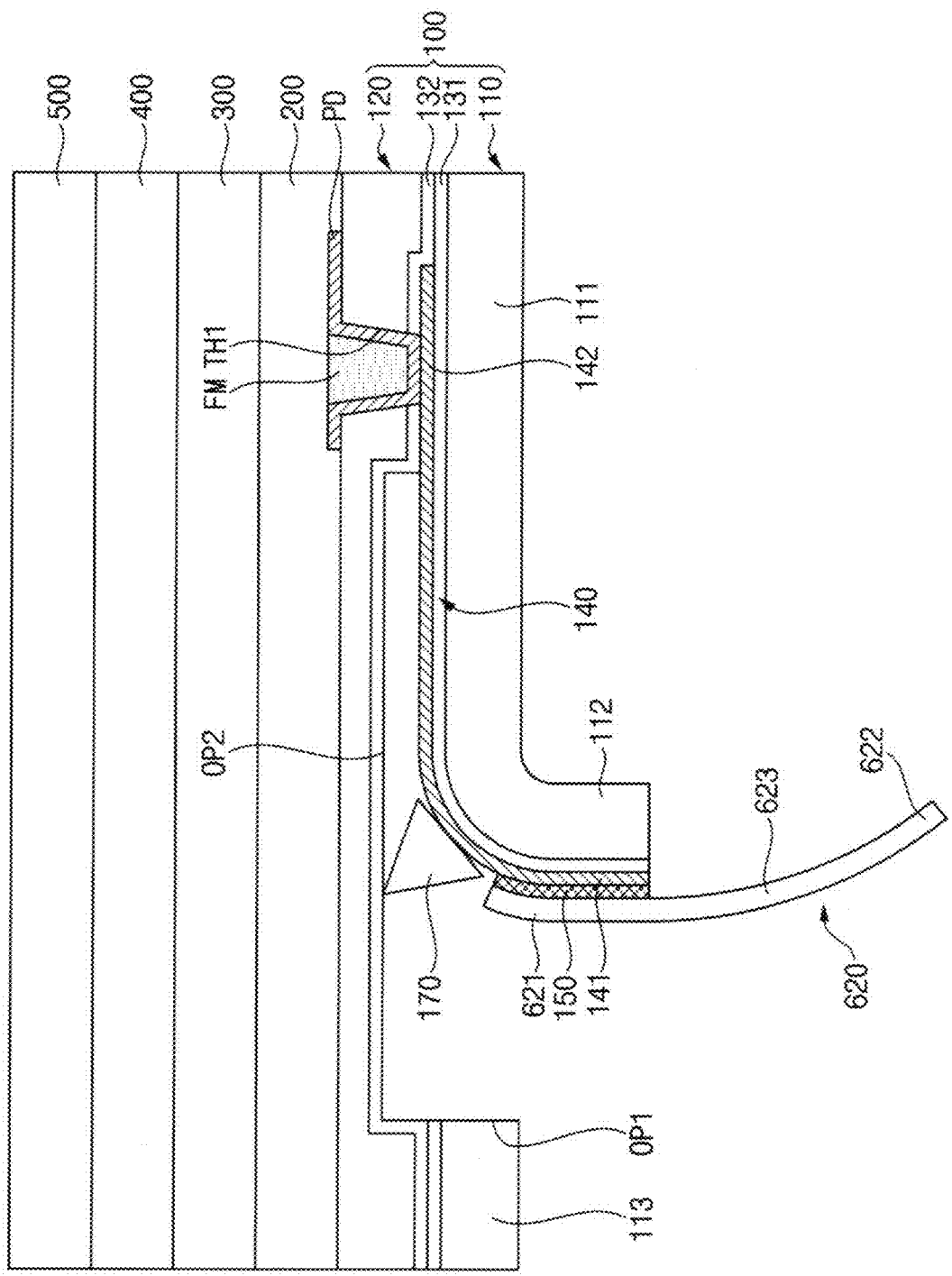
FIG. 19 is a cross-sectional view illustrating an alternative embodiment of FIG. 17.
Figure 20:
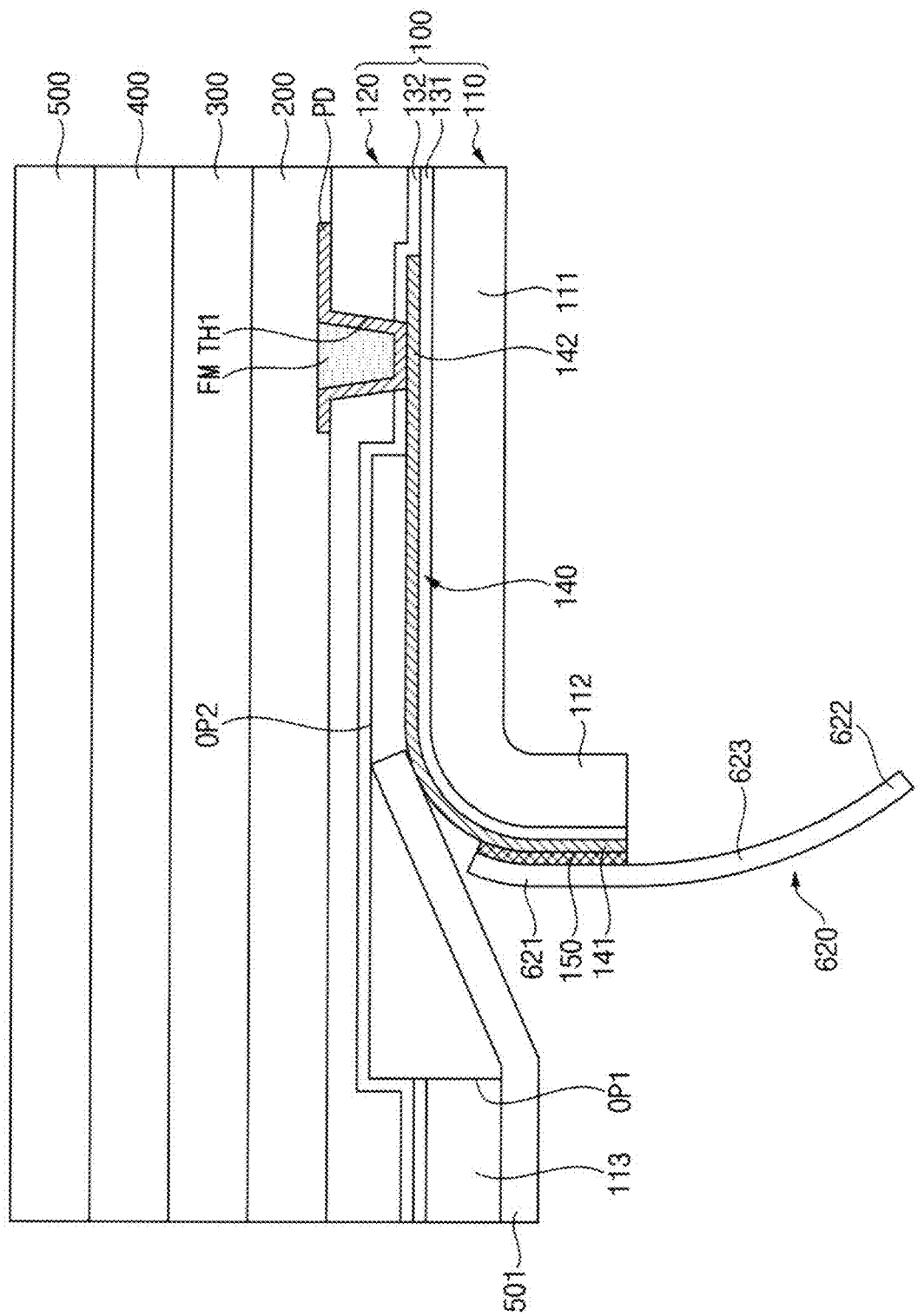
FIG. 20 is a cross-sectional view illustrating another alternative embodiment of FIG. 17.

FIG. 19 is a cross-sectional view illustrating an embodiment of FIG. 17. FIG. 20 is a cross-sectional view illustrating an alternative embodiment of FIG. 17. Particularly, FIGS. 19 and 20 may illustrate the bonding process of the second circuit board 620 to the connection line 140.

Referring to FIG. 19, in an embodiment, when the bonding process is performed, an auxiliary structure 170 may be disposed between the second substrate 120 and the connection line 140. The auxiliary structure 170 may maintain the state in which the second portion 112 of the first substrate 110 is peeled from the second substrate 120 during the bonding process. FIG. 10 shows an embodiment where the auxiliary structure 170 has a triangular cross-sectional shape, but embodiments are not limited thereto. In one embodiment, for example, the auxiliary structure 170 may have various cross-sectional shapes such as a quadrangle, a polygon, a circle, or an oval, or the like.

In one embodiment, for example, the auxiliary structure 170 may be removed after the bonding process is completed. In such an embodiment, when the bonding process is completed, the second portion 112 of the first substrate 110 may be restored to its original state by removing the auxiliary structure 170.

Referring to FIG. 20, in an alternative embodiment, a lower protective film 501 may be disposed under the third portion 113 of the first substrate 110. When the bonding process is performed, an end portion of the lower protective film 501 may be disposed between the second substrate 120 and the connection line 140. The end portion of the lower protective film 501 may maintain the state in which the second portion 112 of the first substrate 110 is peeled from the second substrate 120 during the bonding process.

In one embodiment, for example, the lower protective film 501 may not be removed after the bonding process is completed. The lower protective film 501 may protect the first substrate 110. The end portion of the lower protective film 501 disposed between the second substrate 120 and the connection line 140 may prevent damage to the connection line 140. In one alternative embodiment, for example, the lower protective film 501 may be removed after the bonding process is completed.

Figure 21:
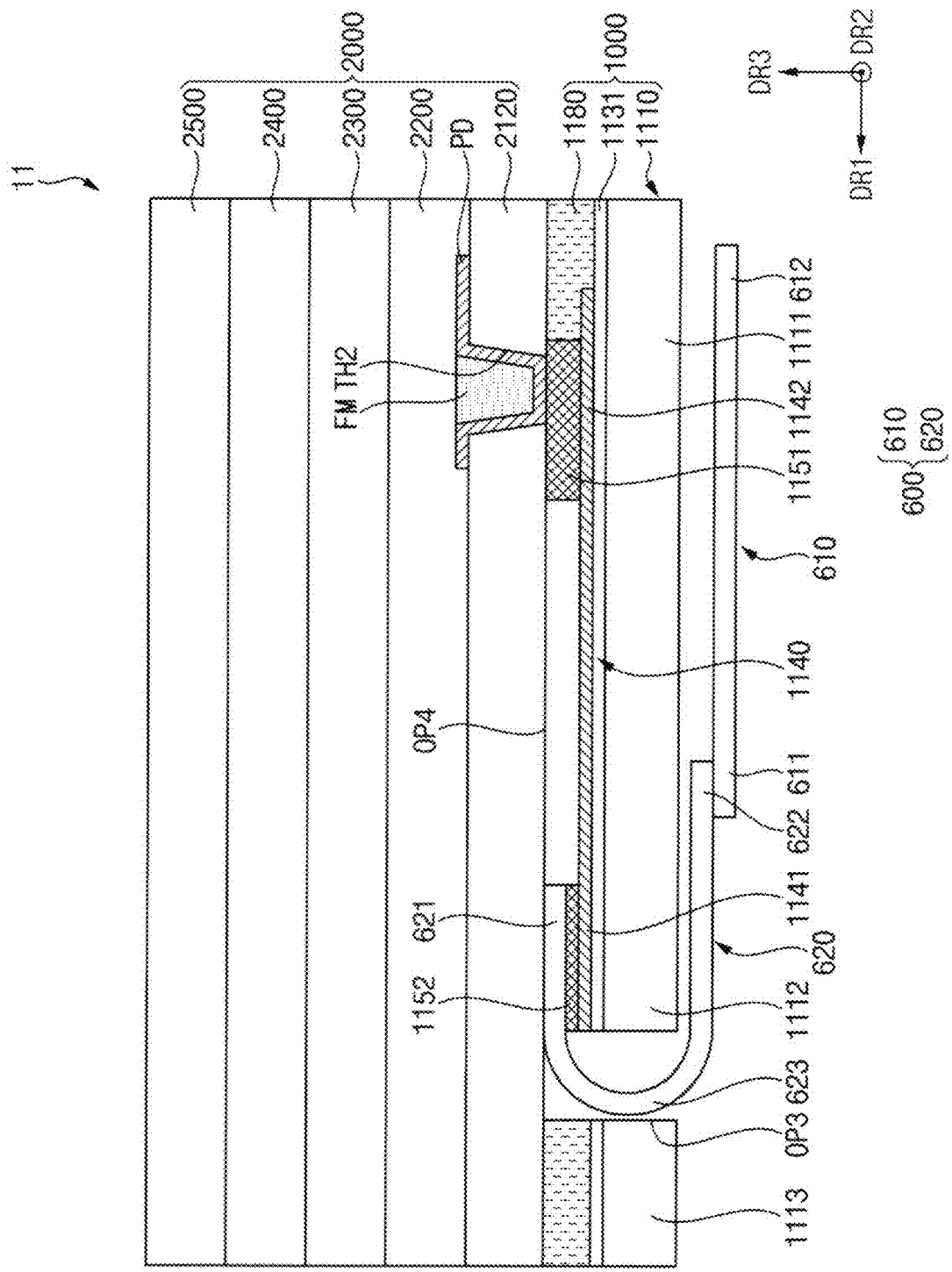
FIG. 21 is a cross-sectional view illustrating a display device according to an alternative embodiment.

FIG. 21 is a cross-sectional view illustrating a display device according to an alternative embodiment. Particularly, FIG. 21 may correspond to FIG. 5. The same or like elements shown in FIG. 21 have been labeled with the same reference characters as used above to describe the embodiment of the display device shown in FIGS. 3 to 6, and any repetitive detailed description thereof will hereinafter be omitted or simplified.

Referring to FIG. 21, an embodiment of a display device 11 may include a lower structure 1000, a upper structure 2000, and a driver 600.

The lower structure 1000 may include a first substrate 1110, a first barrier layer 1131, a connection line 1140, a first conductive adhesive member 1151, a second conductive adhesive member 1152, and an adhesive layer 1180.

The first substrate 1110 may be a transparent insulating substrate. The first substrate 1110 may be flexible and bendable.

The connection line 1140 may be disposed on the first substrate 1110. The connection line 1140 may include a conductive material such as a metal. A second circuit board 620 may be connected to a first end portion 1141 of the connection line 1140, and a pad electrode PD may be connected to a second end portion 1142 of the connection line 1140 opposite to the first end portion 1141.

The first barrier layer 1131 may be disposed between the first substrate 1110 and the connection line 1140. The first barrier layer 1131 may include an inorganic insulating material. The first barrier layer 1131 may improve adhesion between the first substrate 1110 and the connection line 1140.

The first conductive adhesive member 1151 may be disposed on the second end portion 1142 of the connection line 1140. A lower surface of the first conductive adhesive member 1151 may directly contact an upper surface of the second end portion 1142 of the connection line 1140. An upper surface of the first conductive adhesive member 1151 may directly contact a lower surface of the pad electrode PD.

The second conductive adhesive member 1152 may be disposed on the first end portion 1141 of the connection line 1140. A lower surface of the second conductive adhesive member 1152 may directly contact an upper surface of the first end portion 1141 of the connection line 1140. An upper surface of the second conductive adhesive member 1152 may directly contact a lower surface of the first end portion 621 of the second circuit board 620.

The adhesive layer 1180 may be disposed between the first barrier layer 1131 and the upper structure 2000. The adhesive layer 1180 may adhere the lower structure 1000 and the upper structure 2000 to each other. The adhesive layer 1180 may not overlap the first and second conductive adhesive members 1151 and 1152. In one embodiment, for example, the adhesive layer 1180 may be disposed on a first portion 1111 and a third portion 1113 of the first substrate 1110. In such an embodiment, the adhesive layer 1180 may be disposed to surround a second portion 1112 of the first substrate 1110 in a plan view.

A lower surface of the adhesive layer 1180 may directly contact an upper surface of the first barrier layer 1131. An upper surface of the adhesive layer 1180 may directly contact a lower surface of a second substrate 2120 included in the upper structure 2000. The adhesive layer 1180 may be an organic adhesive layer such as an optically clear adhesive ("OCA") film, an optically clear resin ("OCR"), a pressure sensitive adhesive ("PSA") film, or the like. The organic adhesive layer may include an adhesive material such as polyurethane, polyacrylic, polyester, polyepoxy, polyvinyl acetate, or the like.

The upper structure 2000 may include the second substrate 2120, the pad electrode PD, a thin film transistor layer 2200, a light emitting element layer 2300, an encapsulation layer 2400, and a protective film 2500.

The second substrate 2120 may be disposed on the lower structure 1000. In one embodiment, for example, the second substrate 2120 may include a substantially same material as the first substrate 1110.

A second through hole TH2 may be defined in the second substrate 2120 to overlap the second end portion 1142 of the connection line 1140. The second through hole TH2 may be defined through the second substrate 2120 in a thickness direction thereof. The second through hole TH2 may expose at least a portion of the second end portion 1142 of the connection line 1140. The pad electrode PD may be disposed on the second substrate 2120, and may be electrically connected to the second end portion 1142 of the connection line 1140 through the second through hole TH2. In one embodiment, for example, the pad electrode PD may be electrically connected to the connection line 1140 through the first conductive adhesive member 1151.

The thin film transistor layer 2200, the light emitting element layer 2300, the encapsulation layer 2400, and the protective film 2500 may be sequentially disposed on the second substrate 2120. In such an embodiment, the thin film transistor layer 2200, the light emitting element layer 2300, and the encapsulation layer 2400 may be substantially the same as or similar to the thin film transistor layer 200, the light emitting element layer 300, and the encapsulation layer 400 of an embodiment described above with reference to FIG. 9, respectively. Therefore, any repetitive detailed descriptions thereof will be omitted or simplified.

FIGS. 22 to 29 are cross-sectional views illustrating a method of manufacturing a display device according to an alternative embodiment. Particularly, FIGS. 22 to 29 show an embodiment of the method of manufacturing an embodiment of the display device described above with reference to FIG. 21.

Referring to FIGS. 22 to 29, in an alternative embodiment of the method for manufacturing the display device 11, different from an embodiment of the method for manufacturing the display device 10 described above with reference to FIGS. 11 to 18, the lower structure 1000 and the upper structure 2000 may be respectively or separately formed and then combined together.

In one embodiment, for example, lower views of FIGS. 22 to 26 may illustrate a manufacturing method of the lower structure 1000, and upper views may illustrate a manufacturing method of the upper structure 2000. First, the method of manufacturing the lower structure 1000 will be described with reference to FIGS. 22 to 26.

Figure 22:
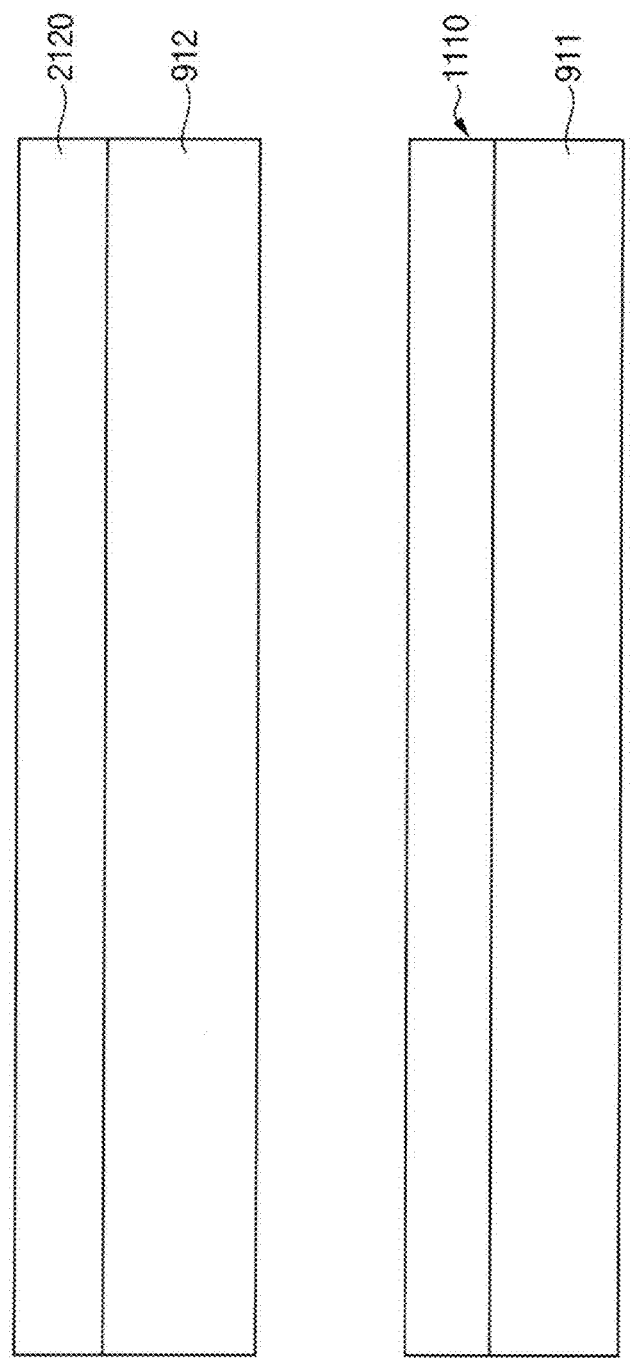
FIGS. 22 to 29 are cross-sectional views illustrating a method of manufacturing a display device according to an alternative embodiment.

Referring to FIG. 22, the first substrate 1110 may be provided or formed on a first carrier substrate 911. The first substrate 1110 may include or be formed of a material having flexibility to enable bending. In one embodiment, for example, the first substrate 1110 may be formed using polyimide.

Figure 23:
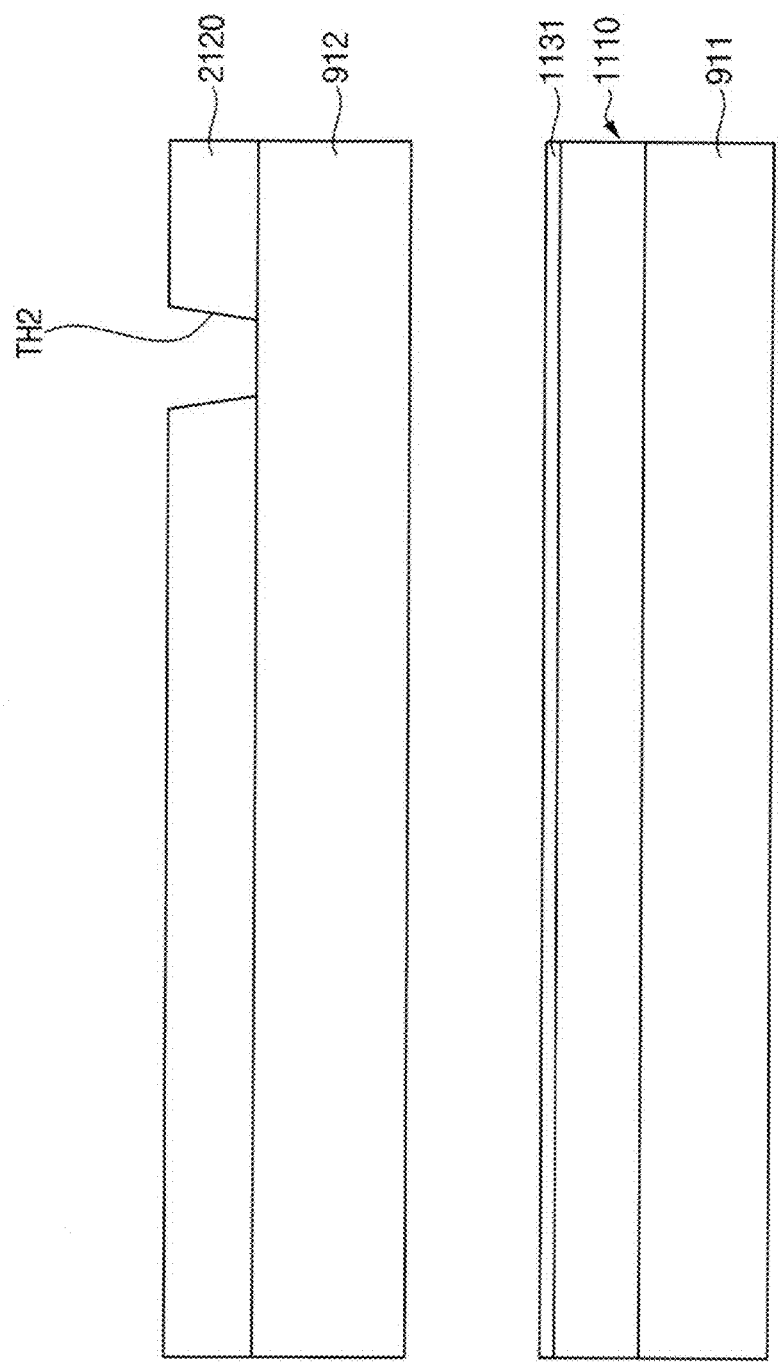

Referring to FIG. 23, the first barrier layer 1131 may be provided or formed on the first substrate 1110. In one embodiment, for example, the first barrier layer 1131 may be formed using an inorganic insulating material.

Figure 24:
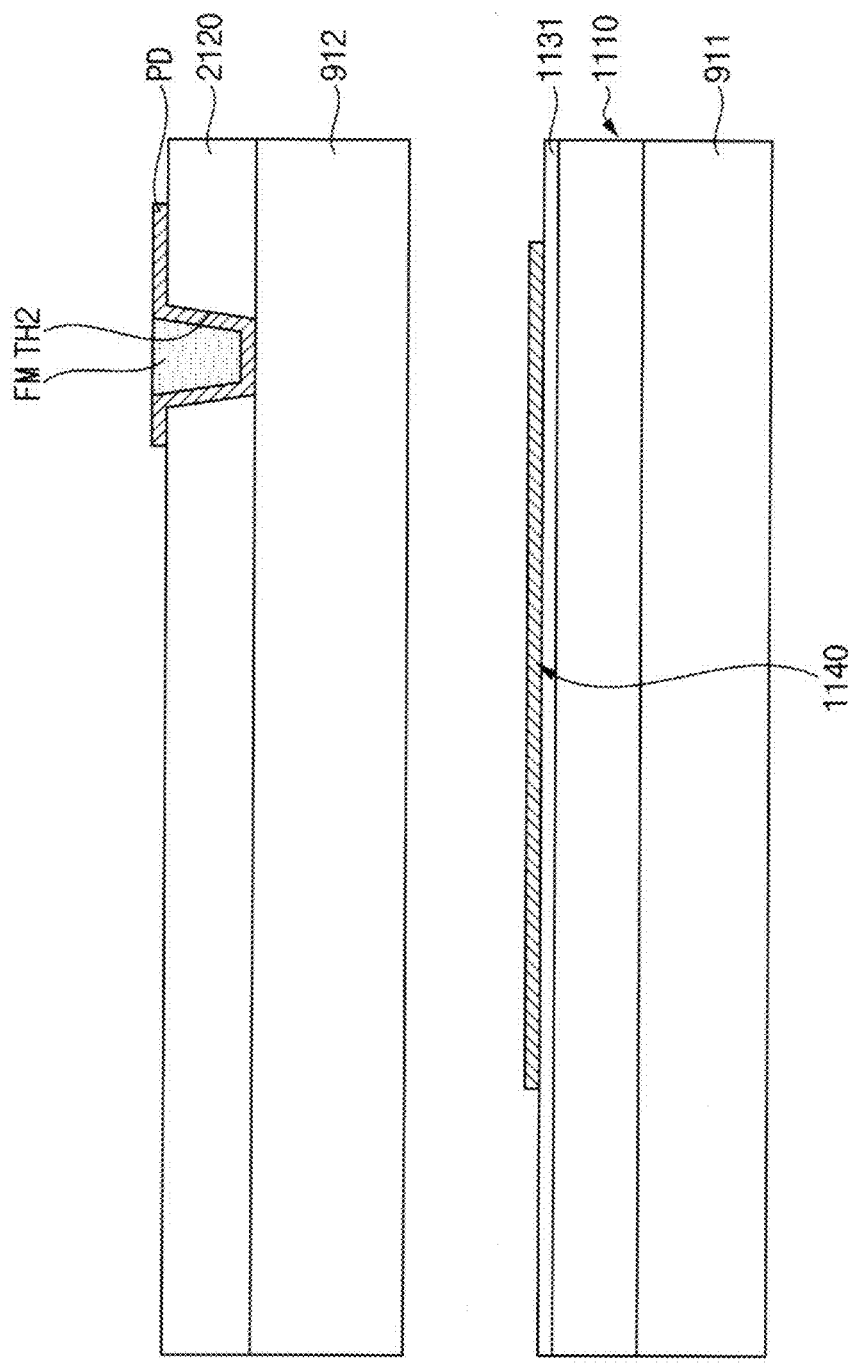

Referring to FIG. 24, the connection line 1140 may be provided or formed on the first substrate 1110. The connection line 1140 may be formed on the first barrier layer 1131. The connection line 1140 may be formed using a conductive material such as a metal.

Figure 25:
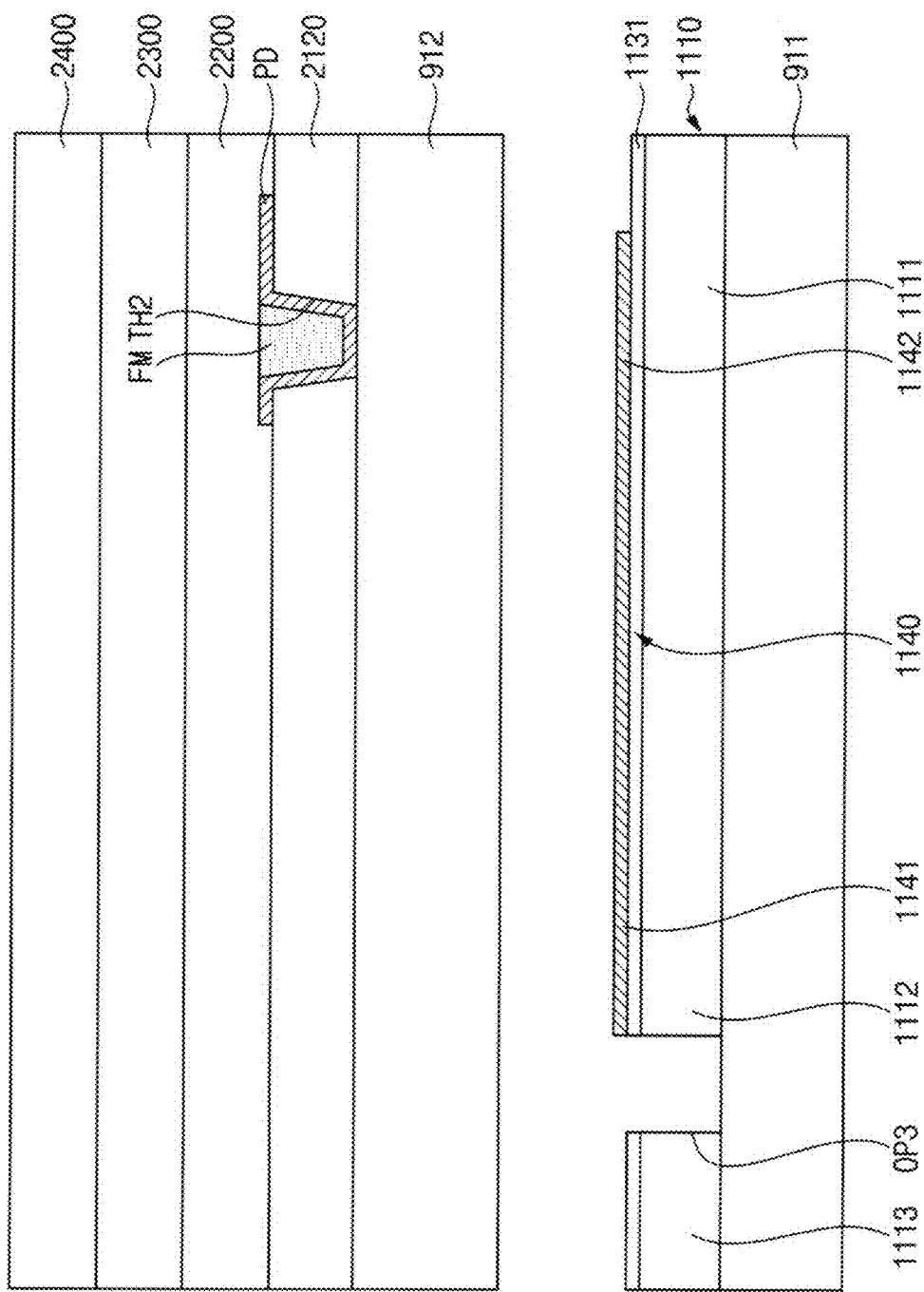

Referring to FIG. 25, a third opening OP3 may be formed in the first substrate 1110. The third opening OP3 may be formed through the first substrate 1110 and the first barrier layer 1131. In one embodiment, for example, the third opening OP3 may be formed to be adjacent to the first end portion 1141 of the connection line 1140. The third opening OP3 may be formed by various processes such as a dry etching process, a wet etching process, a laser drilling process, or the like.

Figure 26:
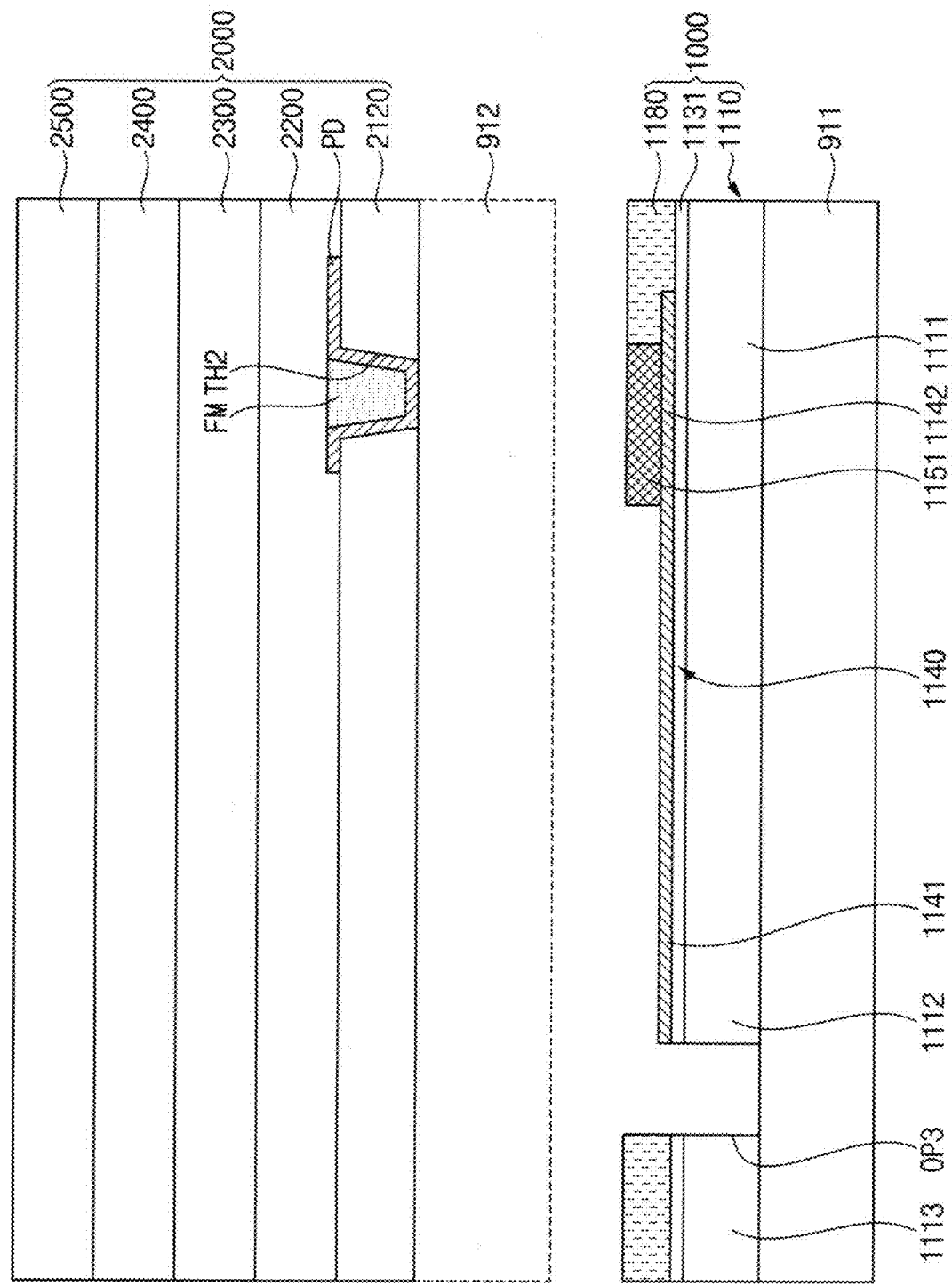

Referring to FIG. 26, the first conductive adhesive member 1151 may be disposed on the second end portion 1142 of the connection line 1140. The lower surface of the first conductive adhesive member 1151 may directly contact the upper surface of the second end portion 1142 of the connection line 1140.

The adhesive layer 1180 may be disposed on the first barrier layer 1131. The adhesive layer 1180 may not overlap the first conductive adhesive member 1151. In one embodiment, for example, the adhesive layer 1180 may be disposed on the first portion 1111 and the third portion 1113 of the first substrate 1110. In such an embodiment, the adhesive layer 1180 may be disposed to surround the second portion 1112 of the first substrate 1110 in a plan view. The lower surface of the adhesive layer 1180 may directly contact the upper surface of the first barrier layer 1131.

In such an embodiment, the lower structure 1000 may be formed on the first carrier substrate 911. The lower structure 1000 may include the first substrate 1110 having flexibility and the connection line 1140 disposed on the first substrate 1110.

Next, the method of manufacturing the upper structure 2000 will be described with reference to FIGS. 22 to 26 again.

Referring to FIG. 22, the second substrate 2120 may be provided or formed on a second carrier substrate 912. In one embodiment, for example, the second substrate 2120 may be formed using a substantially same material as the first substrate 1110.

Referring to FIG. 23, the second through hole TH2 may be formed in the second substrate 2120. The second through hole TH2 may be formed through the second substrate 2120 in a thickness direction thereof. The second through hole TH2 may expose at least a portion of the second carrier substrate 912. The second through hole TH2 may be formed by various processes such as a dry etching process, a wet etching process, a laser drilling process, or the like.

Referring to FIG. 24, the pad electrode PD may be provided or formed on the second substrate 2120. The pad electrode PD may be formed using a conductive material such as a metal. In one embodiment, for example, the pad electrode PD may extend into the second through hole TH2. In such an embodiment, the pad electrode PD may cover a side surface and a bottom surface of the second through hole TH2. The pad electrode PD may directly contact an upper surface of the second carrier substrate 912 exposed through the second through hole TH2.

Referring to FIGS. 25 and 26, the thin film transistor layer 2200, the light emitting element layer 2300, the encapsulation layer 2400, and the protective film 2500 may be sequentially provided on the second substrate 2120 and the pad electrode PD.

In such an embodiment, the upper structure 2000 may be provided or formed on the second carrier substrate 912. The upper structure 2000 may include the thin film transistor layer 2200 including at least one thin film transistor and the pad electrode PD electrically connected to the thin film transistor.

Figure 27:
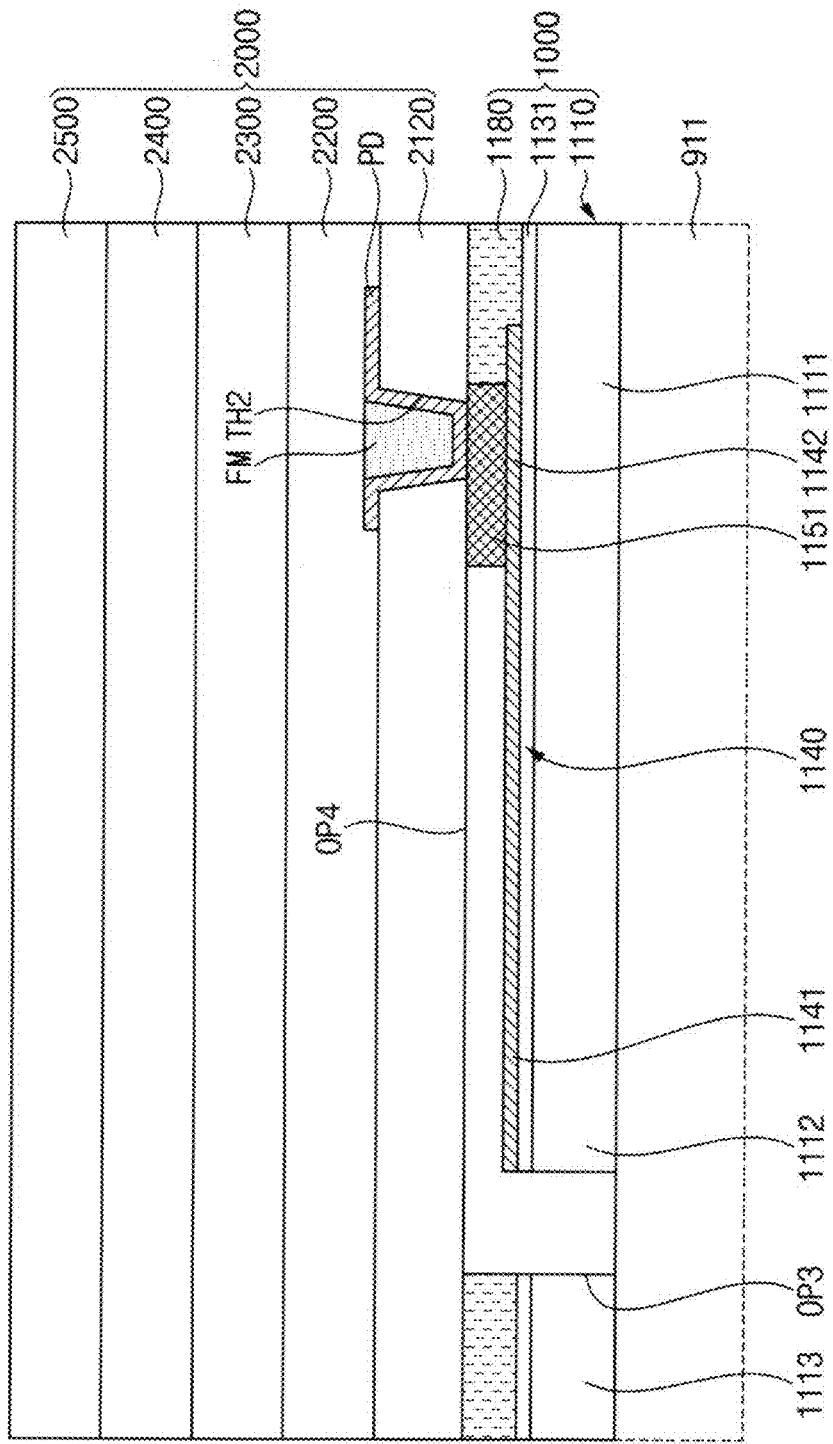

Referring to FIGS. 26 and 27, the second carrier substrate 912 may be separated or removed from the upper structure 2000. The second carrier substrate 912 may be separated or removed from the second substrate 2120. As the second carrier substrate 912 is separated, the lower surface of the pad electrode PD overlapping the second through hole TH2 may be exposed.

The upper structure 2000 may be combined to the lower structure 1000. The upper structure 2000 may be disposed on the lower structure 1000 such that the pad electrode PD may overlap the second end portion 1142 of the connection line 1400. In such an embodiment, the upper structure 2000 may be disposed on the lower structure 1000 such that the exposed lower surface of the pad electrode PD may directly contact the upper surface of the first conductive adhesive member 1151. The first end portion 1141 of the connection line 1140 may be spaced apart from the second substrate 2120. A fourth opening OP4 may be formed between the first end portion 1141 of the connection line 1140 and the second substrate 2120. In such an embodiment, the fourth opening OP4 may be defined by a space between the second substrate 2120 and the connection line 1140 which are spaced apart from each other.

Figure 28:
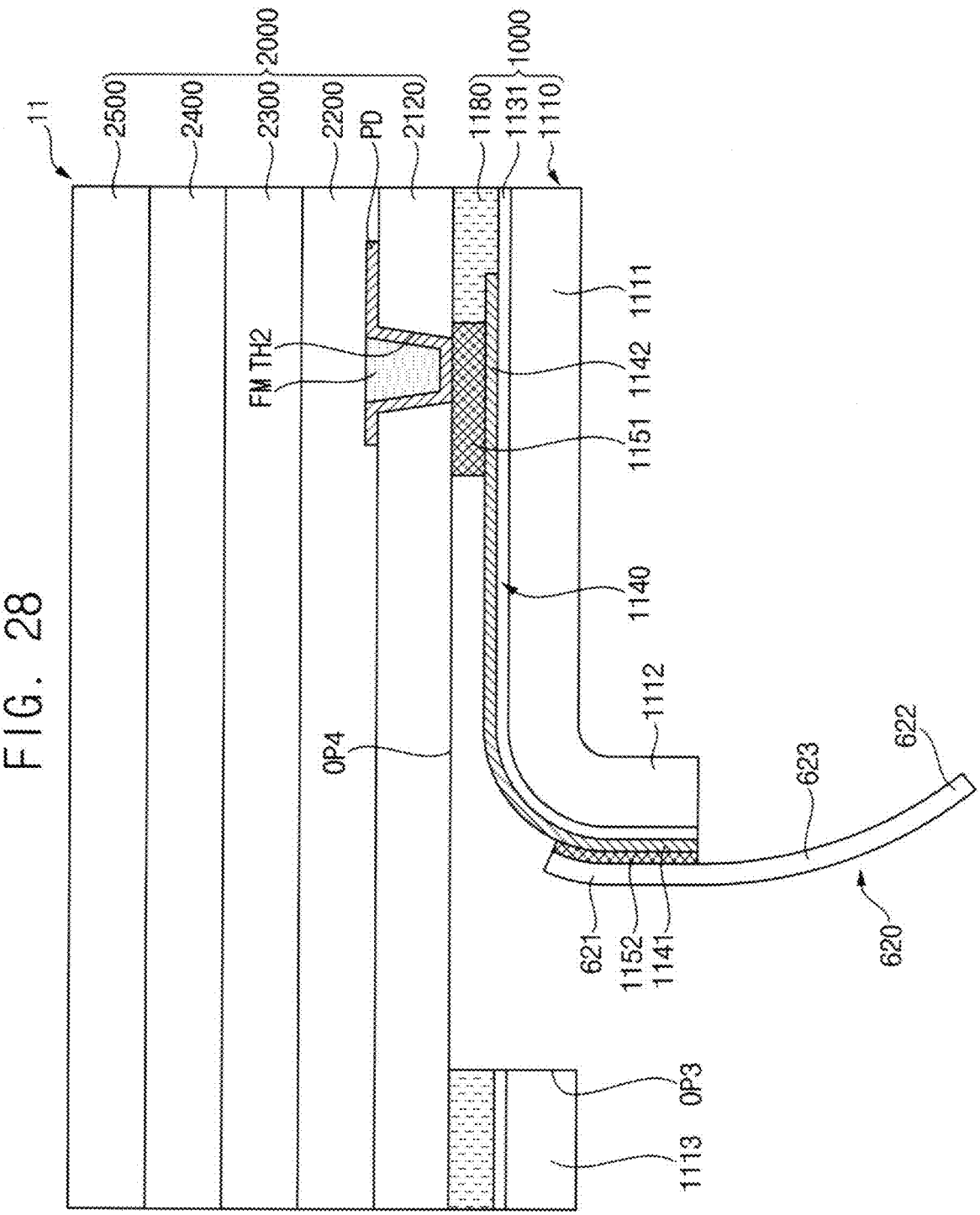

Referring to FIG. 28, the second portion 1112 of the first substrate 1110 may be peeled from the upper structure 2000. In such an embodiment, the first portion 1111 of the first substrate 1110 may be maintained in a fixed state to the upper structure 2000. In one embodiment, for example, the second portion 1112 of the first substrate 1110 may be bent in the downward direction by an external force. In such an embodiment, the first barrier layer 1131 and the connection line 1140 (e.g., the first end portion 1141 of the connection line 1140) disposed on the second portion 1112 of the first substrate 1110 may be bent in the downward direction together with the first substrate 1110.

The second circuit board 620 may be bonded to the connection line 1140. In one embodiment, for example, the first end portion 621 of the second circuit board 620 may be bonded to the first end portion 1141 of the connection line 1140 through the second conductive adhesive member 1152. In such an embodiment, after the second conductive adhesive member 1152 and the first end portion 621 of the second circuit board 620 is disposed on the first end portion 1141 of the connection line 1140, and the second circuit board 620 may be bonded to the connection line 1140 by applying heat and pressure. The second circuit board 620 may be electrically connected to the thin film transistor disposed in the thin film transistor layer 2200 through the connection line 1140 and the pad electrode PD.

In an embodiment the method of manufacturing the display device 11 as described above, the second circuit board 620 may be bonded to the connection line 1140 by peeling the second portion 1112 of the first substrate 1110 from the upper structure 2000 while the first portion 1111 of the first substrate 1110 is fixed to the upper structure 2000. Accordingly, damage to the thin film transistor and the light emitting element disposed in the upper structure 2000 due to heat or pressure applied to the bonding area (i.e., the second portion 1112 of the first substrate 1110) may be effectively prevented or reduced during the bonding process of the second circuit board 620 to the connection line 1140. In such an embodiment, since the bonding process is performed in the state in which the second portion 1112 of the first substrate 1110 is peeled from the upper structure 2000, bonding apparatuses having various sizes may be used.

Figure 29:
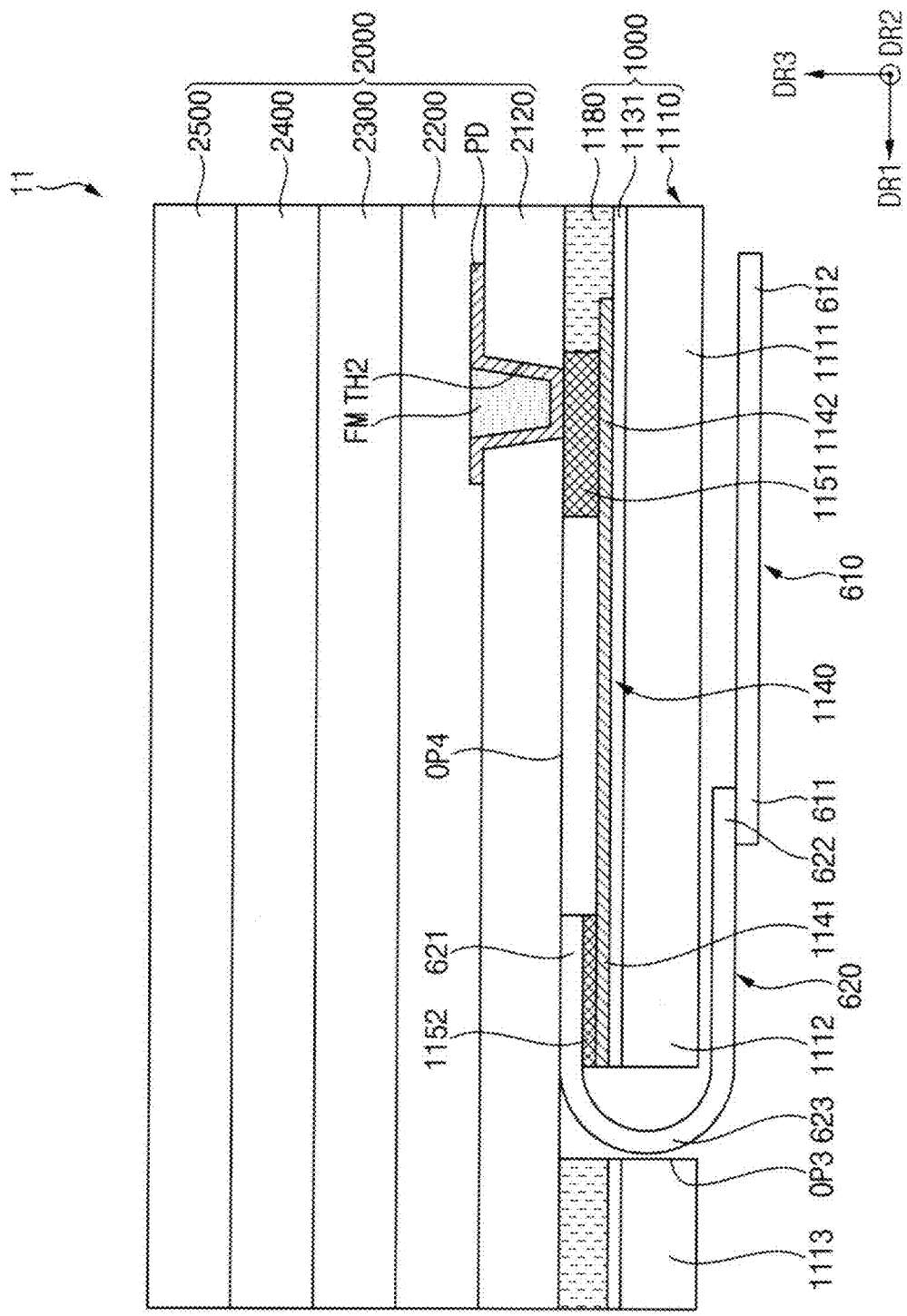

Referring to FIG. 29, the second portion 1112 of the first substrate 1110 may be restored to its original state. In such an embodiment, the second portion 1112 of the first substrate 1110 bent in the downward direction may be moved in the upward direction. In one embodiment, for example, the second portion 1112 of the first substrate 1110 may be restored to its original state by stop applying the external force.

When the second portion 1112 of the first substrate 1110 is restored to its original state, the second circuit board 620 may be bent. In such an embodiment, the first end portion 621 of the second circuit board 620 may be positioned between the first substrate 1110 and the upper structure 2000. The second end portion 622 of the second circuit board 620 may be bent in the downward direction by the bendable portion 623 of the second circuit board 620 to be positioned under the first substrate 1110.

The first circuit board 610 may be bonded to the second circuit board 620. The first end portion 611 of the first circuit board 610 may be bonded to the second end portion 622 of the second circuit board 620 through a conductive adhesive member (not illustrated).

Figure 30:
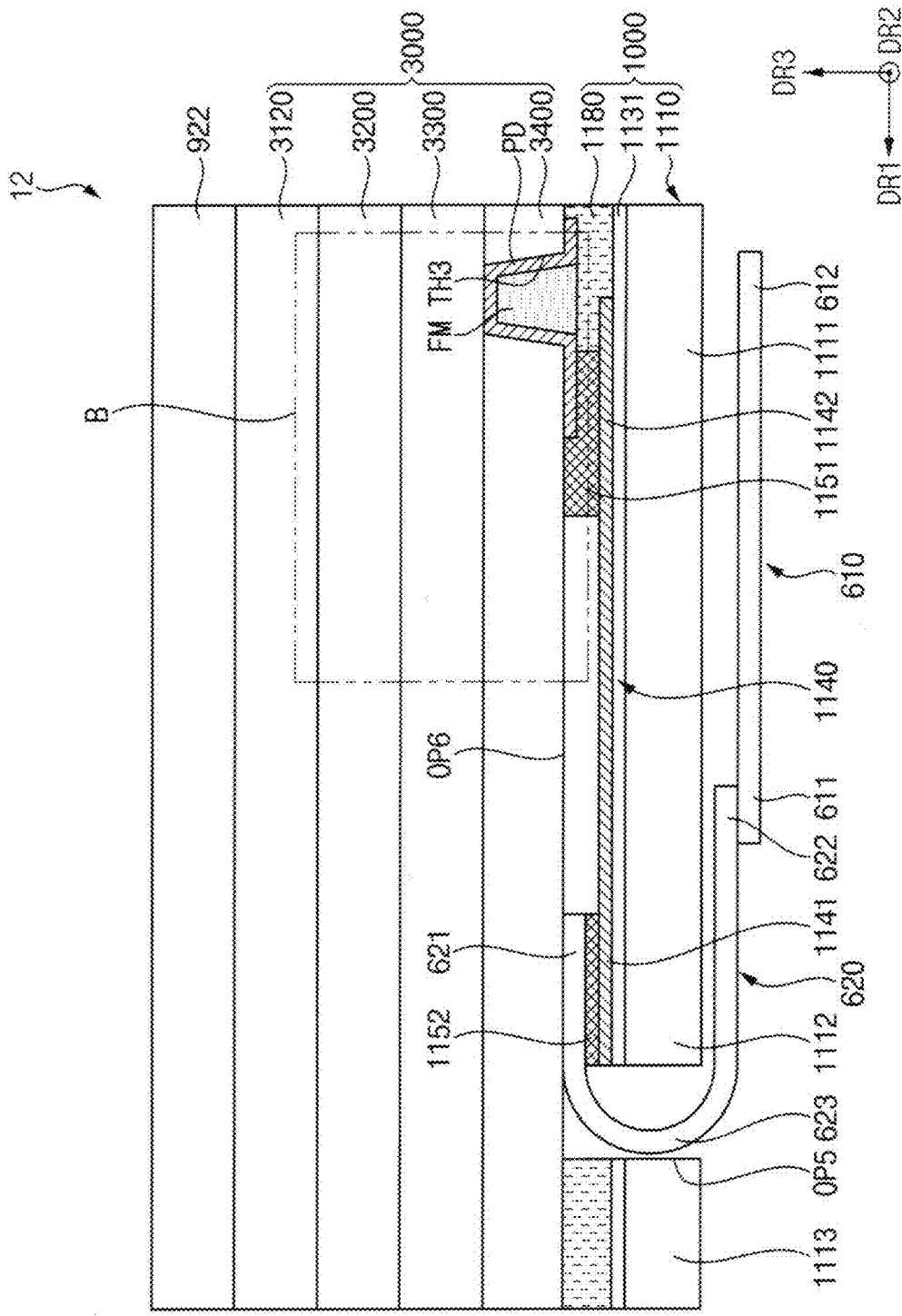
FIG. 30 is a cross-sectional view illustrating a display device according to another alternative embodiment.

FIG. 30 is a cross-sectional view illustrating a display device according to another alternative embodiment. Particularly, FIG. 30 may correspond to FIG. 21. The display device in FIG. 39 is substantially the same as the display device shown in FIG. 21 except for an upper structure 3000. The same or like elements shown in FIG. 30 have been labeled with the same reference characters as used above to describe the embodiment of the display device shown in FIG. 21, and any repetitive detailed description thereof will hereinafter be omitted or simplified.

Referring to FIG. 30, an embodiment of the display device 12 may include a lower structure 1000, an upper structure 3000, a second carrier substrate 922, and a driver 600.

In such an embodiment, a fifth opening OP5 may be defined in the first substrate 1110 of the lower structure 1000.

The upper structure 3000 may include an encapsulation layer 3400, a pad electrode PD, a light emitting element layer 3300, a thin film transistor layer 3200, and a second substrate 3120.

The encapsulation layer 3400 may be disposed on the lower structure 1000. The encapsulation layer 3400 may be disposed between the first substrate 1110 and the light emitting element layer 3300. The encapsulation layer 3400 may be disposed between the connection line 1140 and the light emitting element layer 3300.

A sixth opening OP6 may be defined between the first end portion 1141 of the connection line 1140 and the second substrate 2120. A third through hole TH3 may be defined in the encapsulation layer 3400 to overlap the second end portion 1142 of the connection line 1140. The third through hole TH3 may be defined through the encapsulation layer 3400 in a thickness direction thereof. The third through hole TH3 may expose at least a portion of the second end portion 1142 of the connection line 1140.

The pad electrode PD may be disposed between the connection line 1140 and the encapsulation layer 3400. In one embodiment, for example, the pad electrode PD may be bonded to the second end portion 1142 of the connection line 1140 through the first conductive adhesive member 1151. The pad electrode PD may be electrically connected to the light emitting element disposed in the light emitting element layer 3300 and the thin film transistor disposed in the thin film transistor layer 3200 through the third through hole TH3.

The light emitting element layer 3300, the thin film transistor layer 3200, the second substrate 3120, and the second carrier substrate 922 may be sequentially disposed on the encapsulation layer 3400. The light emitting element layer 3300 may be disposed between the connection line 1140 and the thin film transistor layer 3200.

Figure 31:
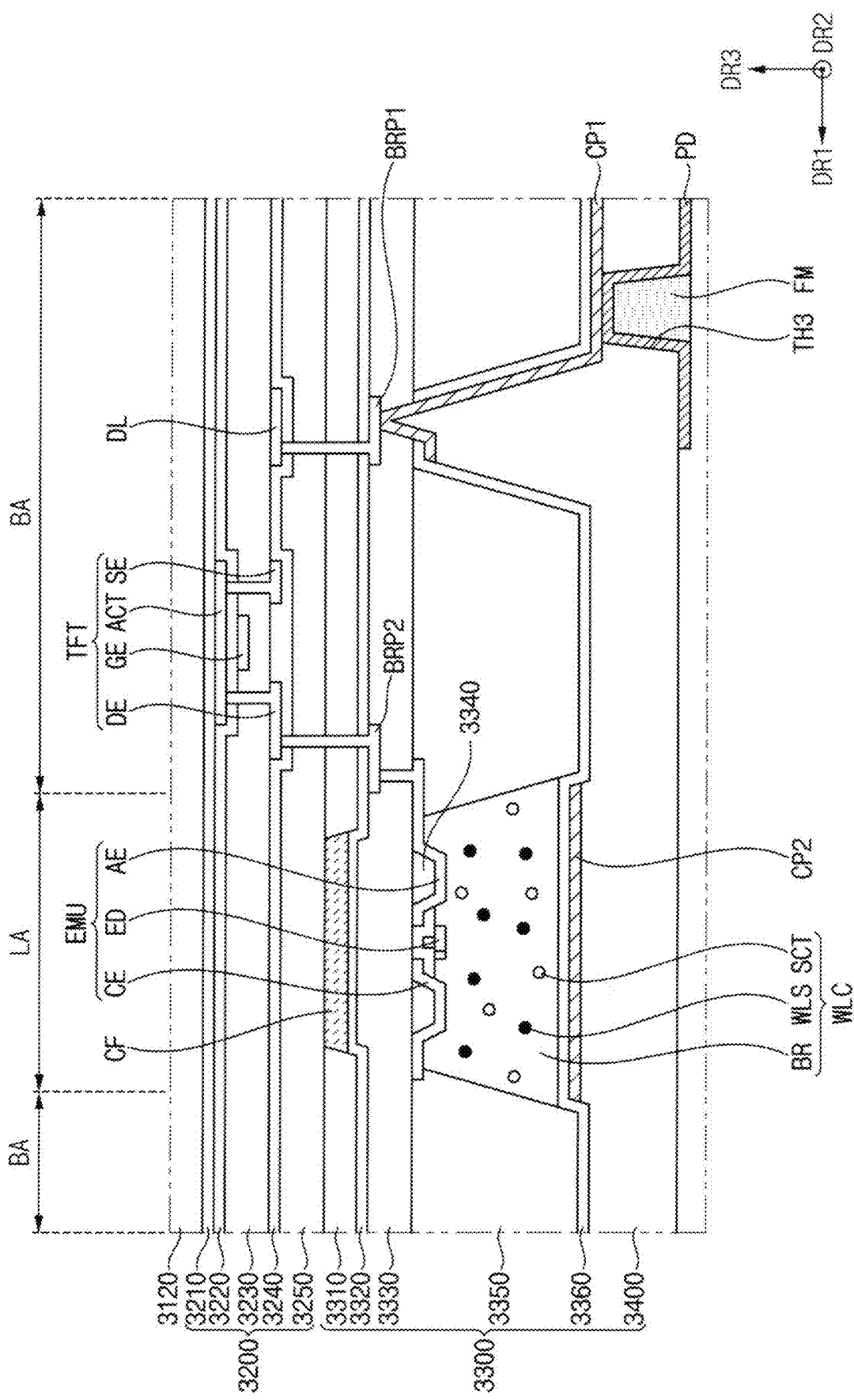
FIG. 31 is an enlarged cross-sectional view of an area 'B' of FIG. 30.

FIG. 31 is an enlarged cross-sectional view of an area 'B' of FIG. 30. Particularly, FIG. 31 may correspond to FIG. 9. The same or like elements shown in FIG. 31 have been labeled with the same reference characters as used above to describe the embodiment of the display device shown in FIG. 9, and any repetitive detailed description thereof will hereinafter be omitted or simplified.

Referring to FIGS. 30 and 31, in an embodiment, the thin film transistor layer 3200 may be disposed under the second substrate 3120. The thin film transistor layer 3200 may include a buffer layer 3210, an active layer ACT, a gate insulating layer 3220, a gate electrode GE, an interlayer insulating layer 3230, a source electrode SE, a drain electrode DE, a data line DL, a first passivation layer 3240, and a first planarization layer 3250 which are sequentially disposed under the second substrate 3120. The active layer ACT, the gate electrode GE, the source electrode SE, and the drain electrode DE may collective define a thin film transistor TFT. The data line DL may be electrically connected to the source electrode SE.

The light emitting element layer 3300 may be disposed under the thin film transistor layer 3200. The light emitting element layer 3300 may include a light blocking layer 3310, a color filter layer CF, a second passivation layer 3320, a first bridge pattern BRP1, a second bridge pattern BRP2, a second planarization layer 3330, a first bank 3340, a first electrode AE, a second electrode CE, a light emitting element ED, a second bank 3350, a wavelength conversion part WLC, a third passivation layer 3360, a first conductive pattern CP1, and a second conductive pattern CP2 which are sequentially disposed under the first planarization layer 3250.

In an embodiment, the first conductive pattern CP1 may contact the pad electrode PD. The first conductive pattern CP1 may contact the first bridge pattern BRP1 through an opening defined in the second bank 3350. The first bridge pattern BRP1 may contact the data line DL through a contact hole formed in the first planarization layer 3250, the light blocking layer 3310, and the second passivation layer 3320. The data line DL may be electrically connected to the source electrode SE. The first electrode AE may contact the second bridge pattern BRP2 through a contact hole defined in the second planarization layer 3330. The second bridge pattern BRP2 may contact the drain electrode DE through a contact hole defined in the first planarization layer 3250, the light blocking layer 3310, and the second passivation layer 3320. Accordingly, the pad electrode PD may be electrically connected to the thin film transistor TFT and the light emitting unit EMU.

The second conductive pattern CP2 may be disposed under the wavelength conversion part WLC to overlap the light emitting area LA. The second conductive pattern CP2 may be a guide member for guiding light generated by the light emitting element ED and passing through the wavelength conversion part WLC in an image display direction (e.g., the third direction DR3) of the display device 12. The light guided in the third direction DR3 by the second conductive pattern CP2 may be emitted to an outside of the display device 12 through the color filter layer CF and the second substrate 3120. The second conductive pattern CP2 may include a conductive material having a constant reflectance. In one embodiment, for example, the second conductive pattern CP2 may include an opaque metal.

In one embodiment, for example, the second conductive pattern CP2 may be disposed in a same layer as the first conductive pattern CP1. The second conductive pattern CP2 may include a substantially same material as the first conductive pattern CP1, and may be substantially simultaneously (or concurrently) formed with the first conductive pattern CP1 during a same process.

FIGS. 32 to 38 are cross-sectional views illustrating a method of manufacturing a display device according to another alternative embodiment. FIGS. 32 to 38 show an embodiment of the method of manufacturing an embodiment of the display device described above with reference to FIGS. 30 and 31.

The method of manufacturing the display device 12 shown in FIGS. 32 to 38 may be substantially same as or similar to the method of manufacturing the display device 11 described above with reference to FIGS. 22 to 29 except for a method of manufacturing the upper structure 3000. The same or like elements shown in FIGS. 32 to 38 have been labeled with the same reference characters as used above to describe the embodiment of the method of manufacturing the display device shown in FIGS. 22 to 29, and any repetitive detailed description thereof will hereinafter be omitted or simplified.

Figure 32:
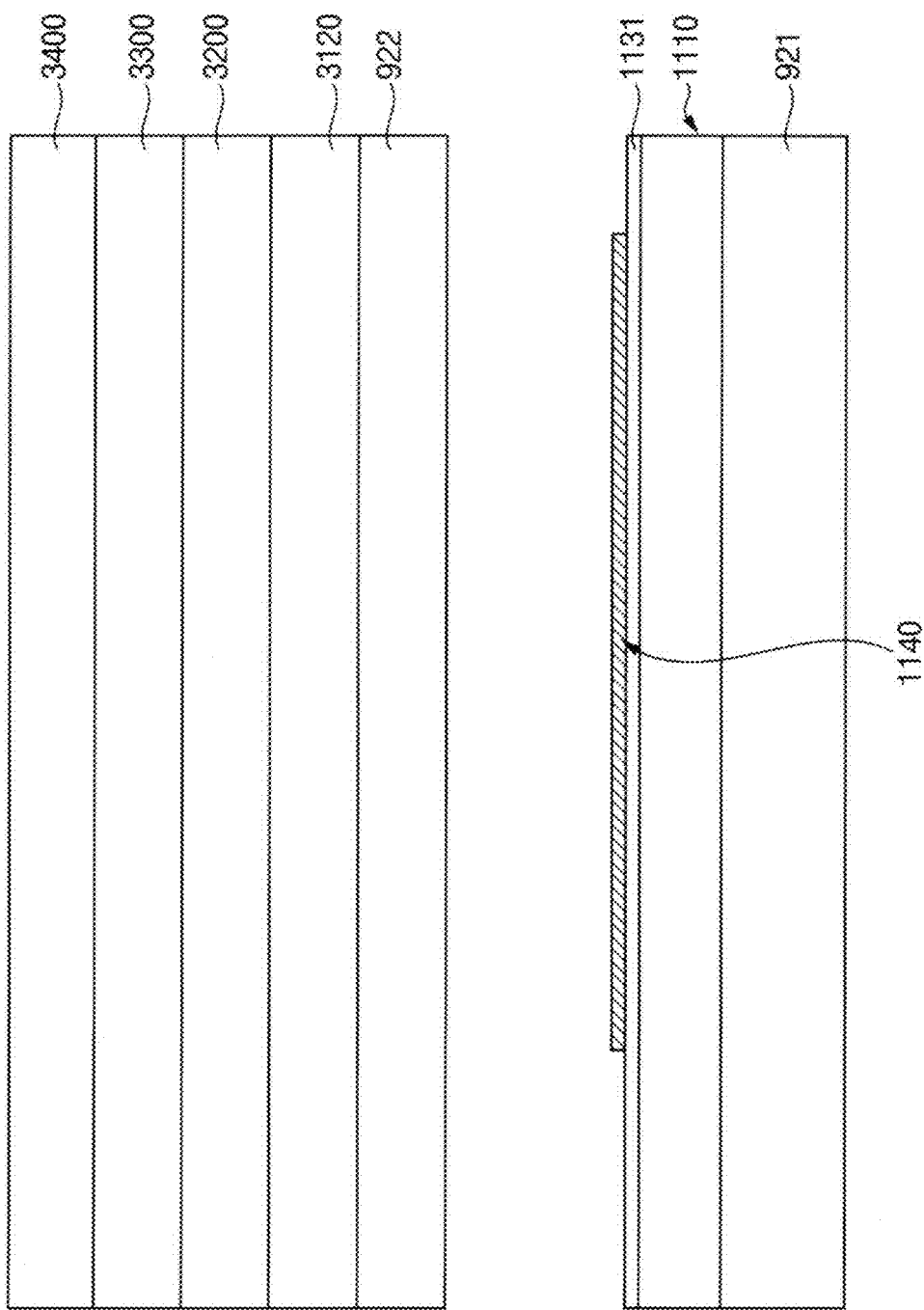
FIGS. 32 to 38 are cross-sectional views illustrating a method of manufacturing a display device according to another alternative embodiment.

Referring to FIG. 32, the second substrate 3120 may be provided or formed on the second carrier substrate 922. The second carrier substrate 922 may secure a structural stability in the manufacturing process of the upper structure 3000. In one embodiment, for example, the second carrier substrate 922 may be a glass substrate. In one embodiment, for example, the second substrate 3120 may be formed using a substantially same material as the first substrate 1110.

The thin film transistor layer 3200, the light emitting element layer 3300, and the encapsulation layer 3400 may be sequentially provided or formed on the second substrate 3120.

Figure 33:
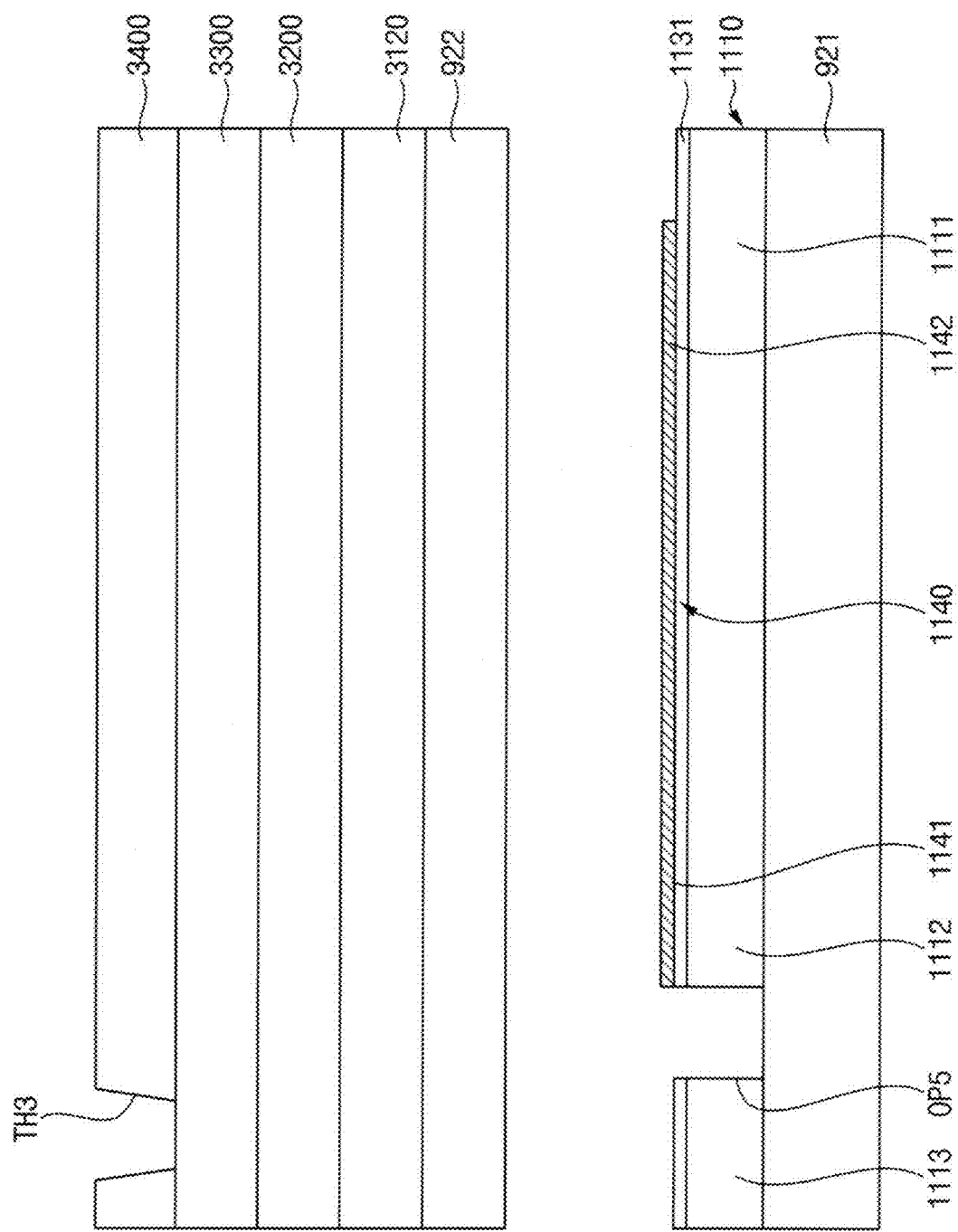

Referring to FIG. 33, the third through hole TH3 may be formed in the encapsulation layer 3400. The third through hole TH3 may be formed through the encapsulation layer 3400 in a thickness direction thereof. The third through hole TH3 may expose at least a portion of a conductive pattern (e.g., the first conductive pattern CP1 of FIG. 31). The third through hole TH3 may be formed by various processes such as dry etching process, wet etching process, laser drilling process, or the like.

Figure 34:
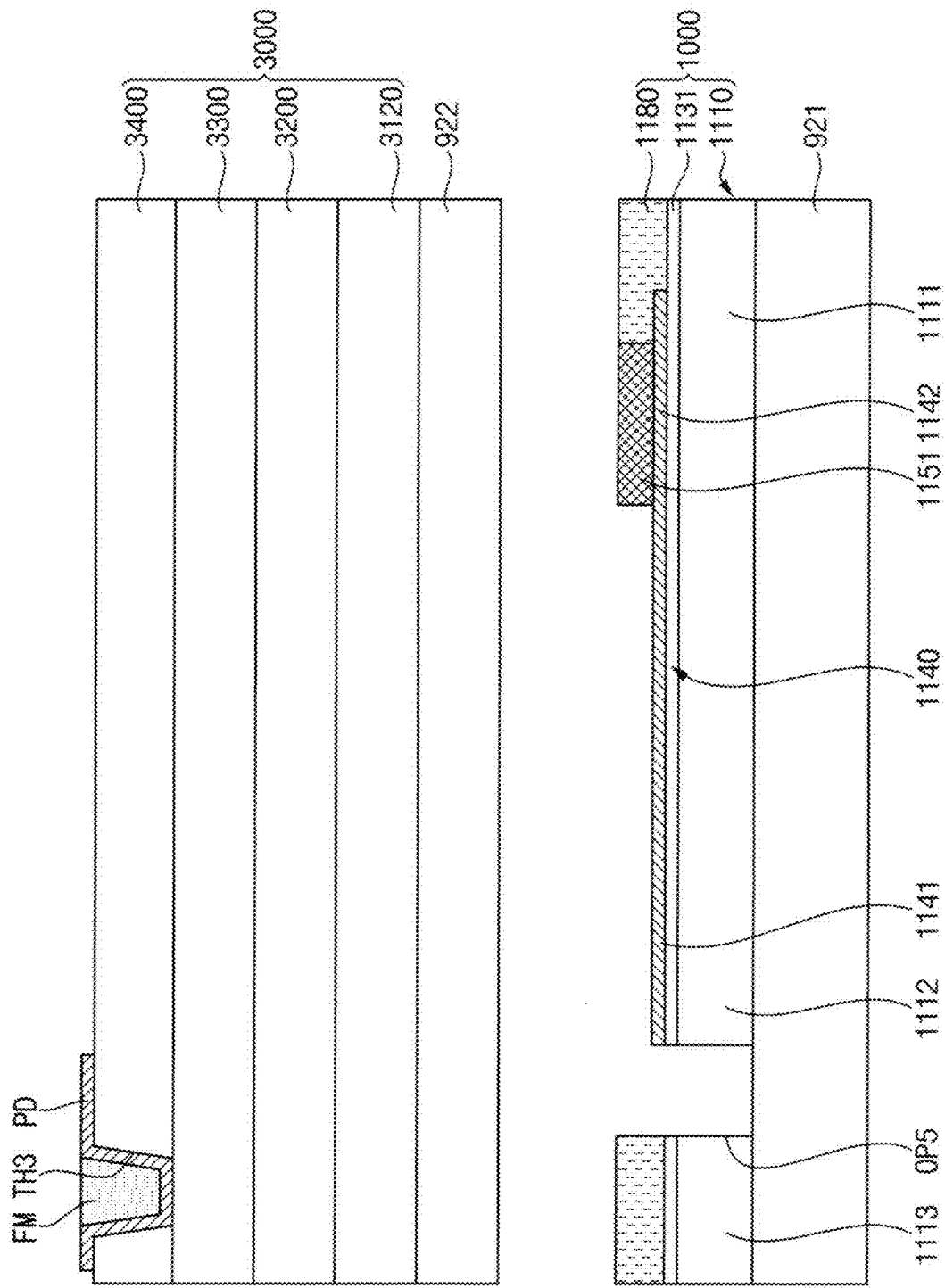
Figure 35:
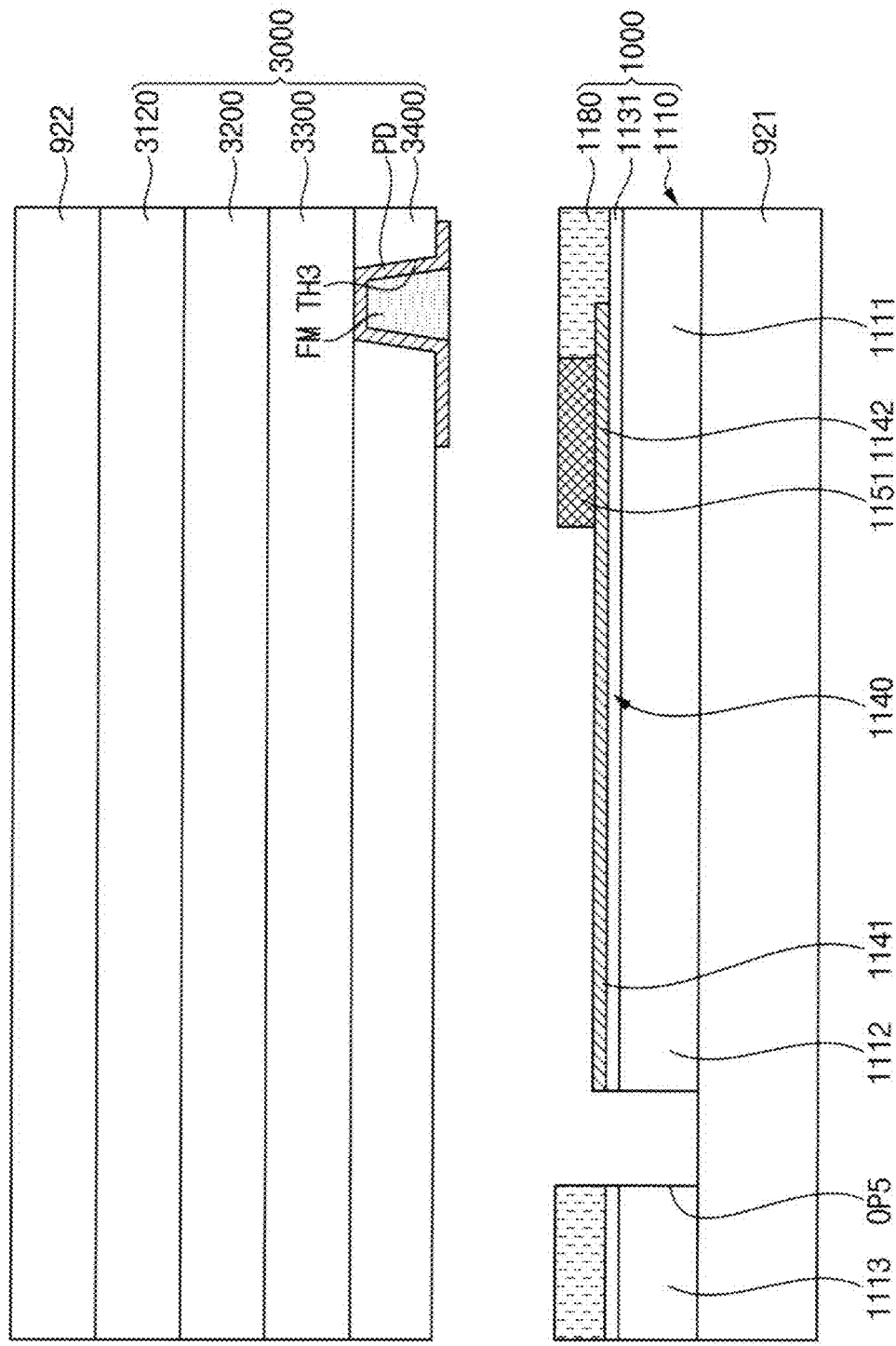

Referring to FIG. 34, the pad electrode PD may be provided or formed on the encapsulation layer 3400. The pad electrode PD may be formed using a conductive material such as a metal. In one embodiment, for example, the pad electrode PD may extend into the third through hole TH3. In such an embodiment, the pad electrode PD may cover a side surface and a bottom surface of the third through hole TH3. The pad electrode PD may directly contact an upper surface of the conductive pattern exposed by the third through hole TH3.

In such an embodiment, the upper structure 3000 may be provided or formed on the second carrier substrate 922. The upper structure 3000 may include the thin film transistor layer 3200 including at least one thin film transistor and the pad electrode PD electrically connected to the thin film transistor.

Referring to 34 and 35, the formed upper structure 3000 may be turned over. In such an embodiment, the upper structure 3000 may be turned over such that the pad electrode PD may be positioned under the thin film transistor layer 3200.

Figure 36:
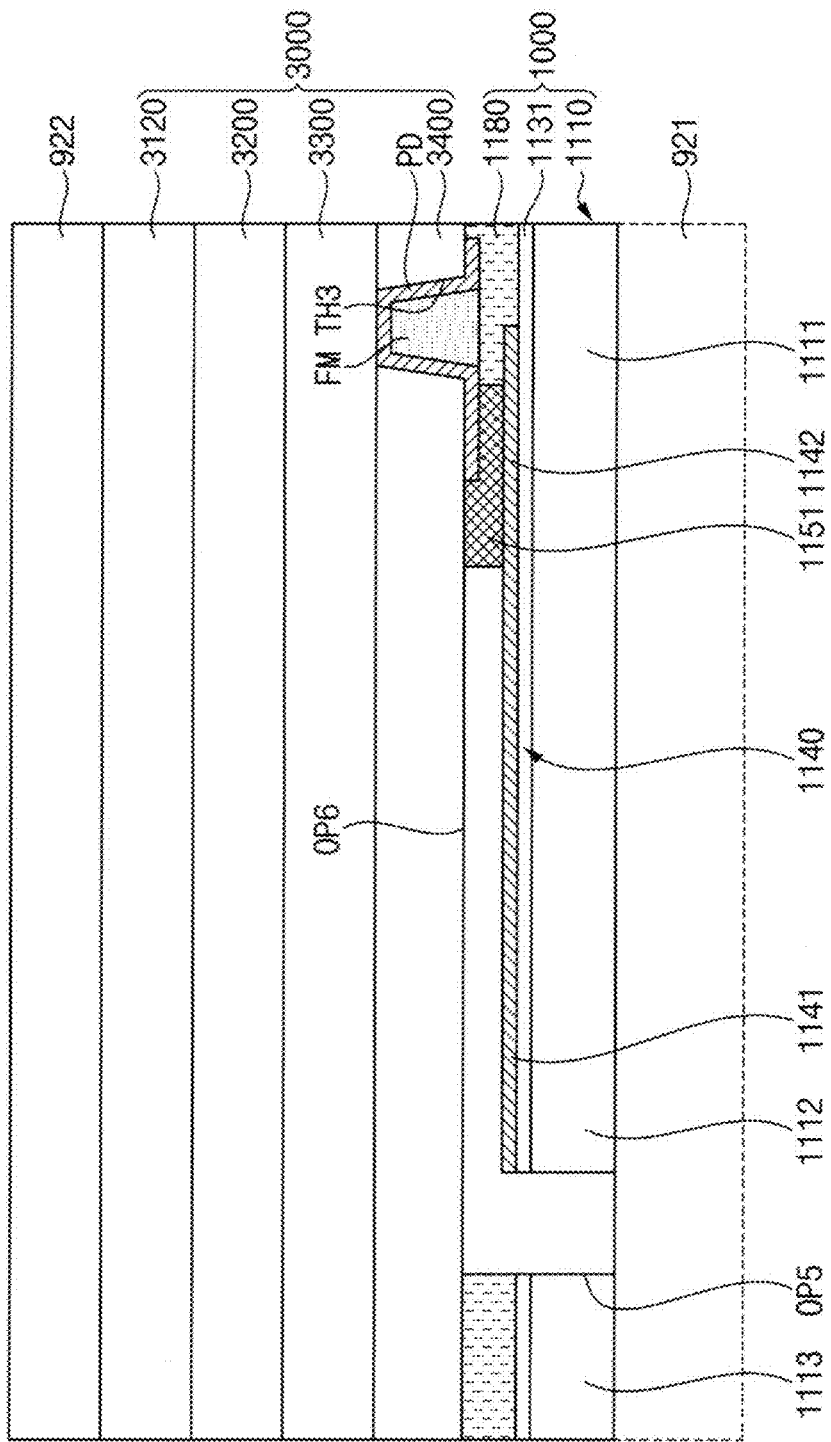

Referring to FIG. 36, the upper structure 3000 may be combined to the lower structure 1000. The upper structure 3000 may be disposed on the lower structure 1000 such that the pad electrode PD may overlap the second end portion 1142 of the connection line 1400. In such an embodiment, the upper structure 3000 may be disposed on the lower structure 1000 such that the lower surface of the pad electrode PD may directly contact the upper surface of the first conductive adhesive member 1151.

Figure 37:
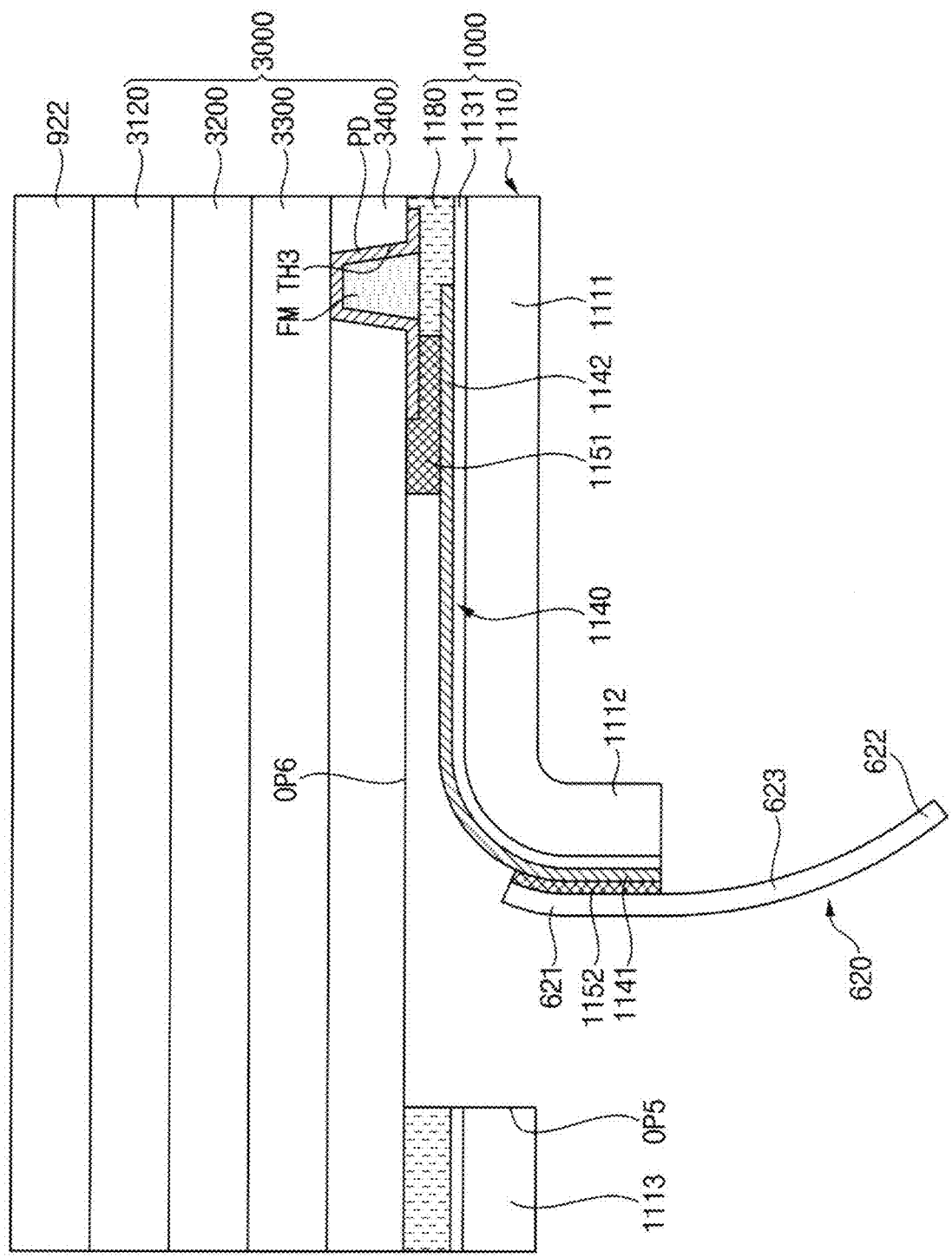
Figure 38:
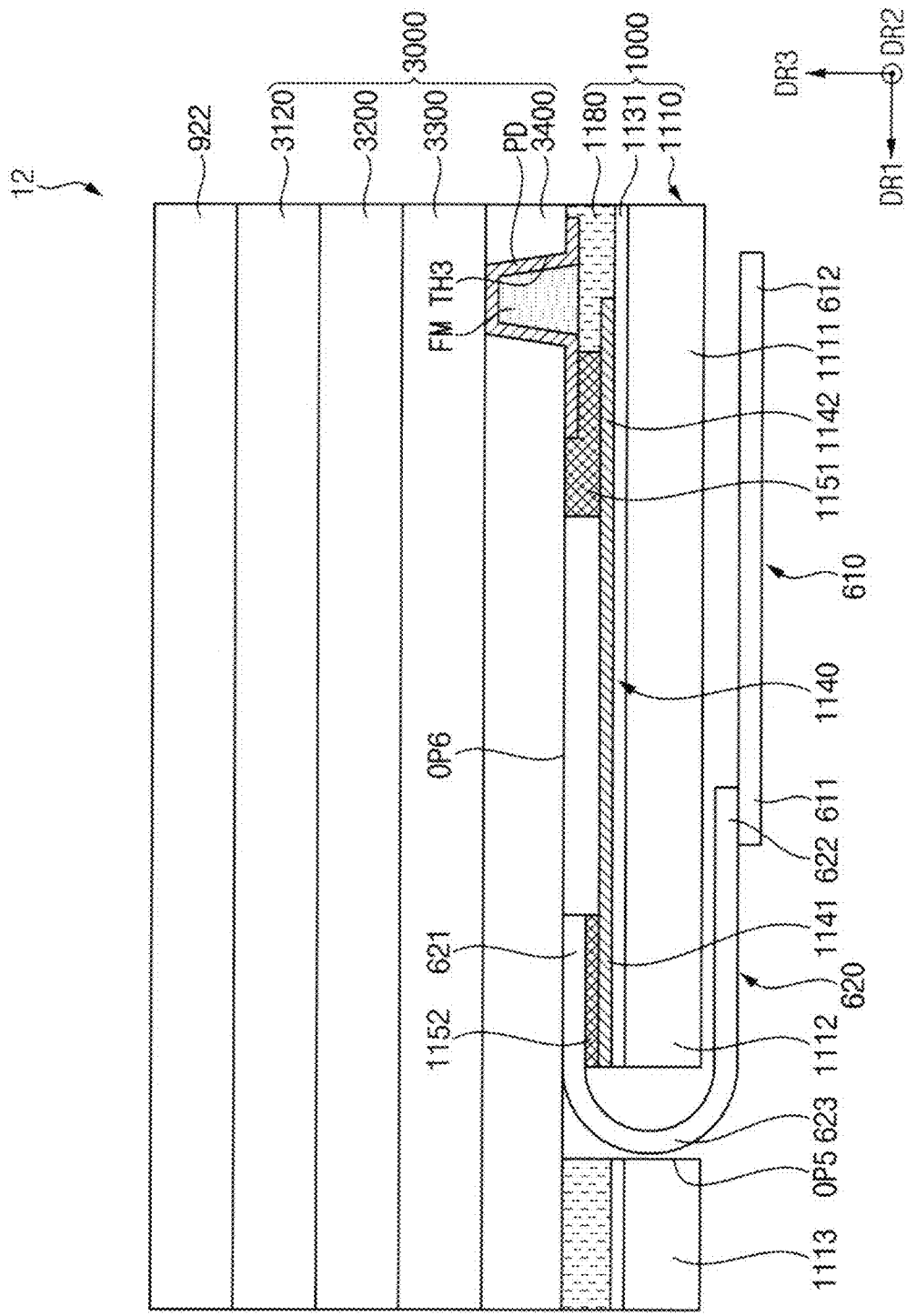

Referring to FIG. 37, the second portion 1112 of the first substrate 1110 may be peeled from the upper structure 3000. In this case, the first portion 1111 of the first substrate 1110 may be maintained in a fixed state to the upper structure 3000. In one embodiment, for example, the second portion 1112 of the first substrate 1110 may be bent in the downward direction by an external force. In such an embodiment, the first barrier layer 1131 and the connection line 1140 (e.g., the first end portion 1141 of the connection line 1140) disposed on the second portion 1112 of the first substrate 1110 may be bent in the downward direction together with the first substrate 1110.

The second circuit board 620 may be bonded to the connection line 1140. In one embodiment, for example, the first end portion 621 of the second circuit board 620 may be bonded to the first end portion 1141 of the connection line 1140 through the second conductive adhesive member 1152. In such an embodiment, after the second conductive adhesive member 1152 and the first end portion 621 of the second circuit board 620 is disposed on the first end portion 1141 of the connection line 1140, and the second circuit board 620 may be bonded to the connection line 1140 by applying heat and pressure. The second circuit board 620 may be electrically connected to the thin film transistor disposed in the thin film transistor layer 3200 through the connection line 1140 and the pad electrode PD.

In one embodiment, for example, the second carrier substrate 922 may not be removed after the manufacturing process of the display device 12 is completed. The second carrier substrate 922 may serve as a window. Various functional layers such as a polarizer, a touch sensing layer, or the like may be disposed between the second carrier substrate 922 and the second substrate 3120. In one alternative embodiment, for example, the second carrier substrate 922 may be removed after the manufacturing process of the display device 12 is completed.

In an embodiment of the method of manufacturing the display device 12, the upper structure 3000 and the lower structure 1000 may be combined without separating the second carrier substrate 922 from the upper structure 3000. In such an embodiment, as the upper structure 3000 is turned over, the second carrier substrate 922 may cover an upper portion of the display device 12. Accordingly, the upper portion of the display device 12 may be protected by the second carrier substrate 922 during the manufacturing process of the display device 12 without attaching a separate protective film. Accordingly, a number of carrier substrates or protective films used for the manufacturing process of the display device 12 may be reduced, and manufacturing costs may be reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a first substrate having a flexibility;
a thin film transistor layer disposed on the first substrate, wherein the thin film transistor layer includes a thin film transistor;
a first circuit board disposed under the first substrate; and
a second circuit board electrically connecting the first circuit board and the thin film transistor to each other, wherein a portion of the second circuit board is disposed between the first substrate and the thin film transistor layer.

2. The display device of claim 1, wherein
a first end portion of the second circuit board is disposed between the first substrate and the thin film transistor layer, and
a second end portion of the second circuit board opposite to the first end portion is disposed under the first substrate.

3. The display device of claim 1, further comprising:
a pad electrode disposed between the first substrate and the thin film transistor layer; and
a connection line disposed between the first substrate and the pad electrode,
wherein a first end portion of the connection line is connected to the second circuit board, and a second end portion of the connection line opposite to the first end portion is connected to the pad electrode.

4. The display device of claim 3, further comprising:
a second substrate disposed between the connection line and the thin film transistor layer.

5. The display device of claim 4, wherein a first end portion of the second circuit board connected to the first end portion of the connection line is disposed between the connection line and the second substrate.

6. The display device of claim 4, further comprising:
a first barrier layer disposed between the first substrate and the connection line; and
a second barrier layer disposed between the connection line and the second substrate.

7. The display device of claim 6, wherein
the first end portion of the connection line is spaced apart from the second barrier layer, and
the second end portion of the connection line contacts the second barrier layer.

8. The display device of claim 7, wherein a first end portion of the second circuit board connected to the first end portion of the connection line is disposed between the connection line and the second barrier layer.

9. The display device of claim 4, wherein the second substrate includes:
a first portion overlapping the second end portion of the connection line and having a first height; and
a second portion overlapping the first end portion of the connection line and having a second height less than the first height.

10. The display device of claim 4, wherein
a through hole is defined through the second substrate to expose at least a portion of the second end portion of the connection line, and
the pad electrode is electrically connected to the connection line through the through hole.

11. The display device of claim 4, further comprising:
a light emitting element layer disposed on the thin film transistor layer; and
an encapsulation layer disposed on the light emitting element layer.

12. The display device of claim 3, further comprising:
a light emitting element layer disposed between the connection line and the thin film transistor layer; and
an encapsulation layer disposed between the connection line and the light emitting element layer.

13. The display device of claim 12, wherein
a through hole is defined through the encapsulation layer to expose at least a portion of the second end portion of the connection line, and
the pad electrode is electrically connected to the connection line through the through hole.

14. The display device of claim 3, wherein the first substrate includes:
a first portion overlapping the second end portion of the connection line; and
a second portion overlapping the first end portion of the connection line.

15. The display device of claim 14, wherein the second portion of the first substrate is disposed at an edge of the first substrate.

16. The display device of claim 14, wherein
the first substrate further includes a third portion spaced apart from the first portion with the second portion interposed therebetween, and spaced apart from the second portion, and
a bending portion of the second circuit board is disposed in an opening defined between the second portion of the first substrate and the third portion of the first substrate.

17. The display device of claim 1, wherein
a first end portion of the first circuit board is connected to the second circuit board, and
the display device further comprises a fixing member which fixes a second end portion of the first circuit board opposite to the first end portion to a lower surface of the first substrate.

18. The display device of claim 17, wherein a first distance between the first substrate and the first end portion of the first circuit board is greater than a second distance between the first substrate and the second end portion of the first circuit board.

* * * * *